United States Patent
Banerjee et al.

(10) Patent No.: US 10,193,508 B2
(45) Date of Patent: Jan. 29, 2019

(54) MULTI-BRANCH OUTPHASING SYSTEM AND METHOD

(71) Applicant: Texas Instruments Incorporated, Dallas, TX (US)

(72) Inventors: Aritra Banerjee, Dallas, TX (US); Rahmi Hezar, Allen, TX (US); Lei Ding, Plano, TX (US); Nathan Richard Schemm, Rowlett, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/255,164

(22) Filed: Apr. 17, 2014

(65) Prior Publication Data
US 2015/0303961 A1 Oct. 22, 2015

(51) Int. Cl.
*H03F 3/217* (2006.01)
*H03F 3/193* (2006.01)
(Continued)

(52) U.S. Cl.
CPC ........... *H03F 3/193* (2013.01); *H03F 1/0277* (2013.01); *H03F 1/0294* (2013.01); *H03F 1/223* (2013.01);
(Continued)

(58) Field of Classification Search
CPC ...... H03F 3/217; H03F 3/2176; H03F 3/2178; H03F 1/0277
(Continued)

(56) References Cited

U.S. PATENT DOCUMENTS 4,890,073 A * 12/1989 Flachenecker et al. ......... 331/55
7,830,209 B1 * 11/2010 Woodford et al. ........... 330/297
(Continued)

FOREIGN PATENT DOCUMENTS

| CN | 1788212 A | 6/2006 |
| CN | 102017400 A | 4/2011 |

(Continued)

OTHER PUBLICATIONS

"Idealized Operatioin of the Class E Tuned Power Amplifier" by Frederick H. Raab, IEEE Transactions on Circuits and Systems, vol. CAS-24, No. 12, Dec. 1977, pp. 725-735.
(Continued)

*Primary Examiner* — Kevin M Burd
(74) *Attorney, Agent, or Firm* — Michael A. Davis, Jr.; Charles A. Brill; Frank D. Cimino

(57) ABSTRACT

A multi-level, multi-branch outphasing amplifier (20-1) includes a first branch group circuit (22-1) including a first branch circuit (11) receiving a first RF input signal ($S_1(t)$) and first control information ($S_{11}\_Ctrl=V_{DD}$) and a second branch circuit (12) receiving the first input signal and second control information ($S_{12}\_Ctrl$). Each of the first (11) and second (12) branch circuits includes a power amplifier. The second control information enables the second branch circuit to be switched on or off while the first branch circuit (12) remains on. A second branch group circuit (22-2) includes a third branch circuit (21) receiving a second RF input signal ($S_2(t)$) and third control information ($S_{21}\_Ctrl=V_{DD}$) and a fourth branch circuit (22) receiving the second input signal ($S_2(t)$) and fourth control information ($S_{22}\_Ctrl$). Each of the third and fourth branch circuits includes a power amplifier. The fourth control information enables the fourth branch circuit to be switched on or off while the third branch circuit (Continued)

remains on. A combiner (24) combines output signals of the power amplifiers to produce an output signal ($S_{OUT}(t)$).

14 Claims, 9 Drawing Sheets

(51) Int. Cl.
    *H03F 1/02*     (2006.01)
    *H03F 1/22*     (2006.01)
    *H03F 3/21*     (2006.01)
    *H03F 3/24*     (2006.01)
    *H03F 3/72*     (2006.01)

(52) U.S. Cl.
    CPC ............ *H03F 3/211* (2013.01); *H03F 3/245* (2013.01); *H03F 3/72* (2013.01); *H03F 2200/411* (2013.01); *H03F 2200/511* (2013.01); *H03F 2200/541* (2013.01); *H03F 2203/21136* (2013.01); *H03F 2203/21142* (2013.01); *H03F 2203/7215* (2013.01); *H03F 2203/7236* (2013.01)

(58) Field of Classification Search
    USPC ......................................... 375/287, 297, 295
    See application file for complete search history.

(56) References Cited

U.S. PATENT DOCUMENTS

| | | | |
|---|---|---|---|
| 8,164,384 | B2 | 4/2012 | Dawson et al. |
| 2006/0132348 | A1* | 6/2006 | Valand ..................... G01S 5/04 342/13 |
| 2007/0105511 | A1* | 5/2007 | Koller .......................... 455/126 |
| 2010/0019843 | A1* | 1/2010 | Hellberg et al. .......... 330/124 R |
| 2010/0141168 | A1* | 6/2010 | Zhang et al. ................. 315/291 |
| 2013/0033296 | A1* | 2/2013 | Kishimoto ................ H01P 1/18 327/237 |
| 2013/0210376 | A1 | 8/2013 | Hur et al. |

FOREIGN PATENT DOCUMENTS

| | | |
|---|---|---|
| CN | 102356542 A | 2/2012 |
| CN | 102904531 A | 1/2013 |

OTHER PUBLICATIONS

"Efficiency of Outphasing RF Power-Amplifier Systems" by Frederick H. Raab, IEEE Transactions on Communications, vol. COM-33, No. 10, Oct. 1985, pp. 10941099.
"CMOS Outphasing Class-D Amplifier With Chireix Combiner" by David K. Choi et al., IEEE Microwave and Wireless Components Letters, vol. 17, No. 8, Aug. 2007, pp. 619-621.
"HF outphasing transmitter using class-E power amplifiers" by Ramon Beltran et al., IEEE, 2009, pp. 757-760.
"A 2.4-GHz, 27-dBm Asymmetric Multilevel Outphasing Power Amplifier in 65-nm CMOS" by Philip A. Godoy et al., IEEE Journal of Solid-State Circuits, vol. 47, No. 10, Oct. 2012, pp. 2372-2384.
"Asymmetric Multilevel Outphasing Transmitter using Class-E PAs with Discrete Pulse Width Modulation" by SungWon Chung et al., IEEE 2010, pp. 264-267.
Search Report for Chinese Patent Application No. 2015101811893, dated Aug. 3, 2018 (2 pages).

* cited by examiner

MULTI-BRANCH OUTPHASING SYSTEM AND METHOD

BACKGROUND OF THE INVENTION

The present invention relates generally to multi-level outphasing power amplifiers, and more particularly to asymmetric multi-level, multi-branch outphasing power amplifiers which have improved power efficiency and which do not require switching between multiple power supply voltages.

A problem of the prior art is that the need for high data rates and efficient spectrum utilization in modem wireless communication systems results in high peak-to-average power ratios of modulated signals. This requires associated RF power amplifiers (PAs) to operate much of the time at greatly reduced output power levels, which is referred to as large "power back-off" operation. Traditional power amplifiers have much lower efficiency (i.e., power delivered by the amplifier to the load divided by total power consumed by the power amplifier) under large power back-off conditions than under peak output power conditions.

In handheld devices, low power efficiency of the RF power amplifiers results in shorter battery lifetimes, and in base station applications the low power efficiency of the RF power amplifiers may result in wasted power and high heat sinking costs.

Outphasing or linear amplification using nonlinear components (LINC techniques) produce amplitude modulation by combining the output of two power amplifiers that are driven by constant envelope phase modulated signals. Outphasing power amplifier configurations also have been reported in the past using switching power amplifiers such as class D and class-E amplifiers. See "Efficiency of Outphasing RF Power-Amplifier Systems", by F. Raab, IEEE Transactions on Communications, Vol. 33, No. 10, pp. 1094-1099, October 1985; this article discloses efficiency trade-offs and efficiency analysis for outphasing amplifiers. Also see US Patent Application Publication 2013/00210376 published Aug. 15, 2013 by Hur et al., entitled "LINC Transmitter with Improved Efficiency"; also see the articles "HF Outphasing Transmitter Using Class-E Power Amplifiers" by Beltran et al., IEEE MTT-S International Microwave Symposium, pp. 757-760, June, 2009, and "CMOS Outphasing Class-D Amplifier with Chireix Combiner" by Hung et al., IEEE Microwave and Wireless Components Letters, Vol. 17, No. 8, pp. 619-621, August 2007.

Prior Art FIG. 1 generally indicates how the drive signals $S_1(t)$ and $S_2(t)$ on conductors 14A and 14B, respectively, are generated in a basic out phasing system. (The basic outphasing technique is described in the above mentioned article "Efficiency of Outphasing RF Power-Amplifier Systems" by F. Raab.) In FIG. 1, drive signals $S_1(t)$ and $S_2(t)$ in the half-circle 17 are generated by signal separation circuit 15 in response to the incoming amplitude and phase modulated signal S(t) represented by the vector 17C. Drive signals $S_1(t)$ and $S_2(t)$ are represented by vectors 17A and 17B, respectively, in the half-circle 17. Specifically, in the outphasing power amplifier, the incoming signal with amplitude and phase modulation $$S(t)=a(t)e^{j\phi(t)}$$

is decomposed into two constant envelope phase modulated signals $S_1(t)$ and $S_2(t)$ on conductors 14A and 14B, respectively, as $$S_{1,2}(t)=Ae^{j[\phi(t)\pm\theta(t)]}$$

where $$\theta(t)=\cos^{-1}[a(t)/(2A)]$$

and the constant amplitude A is defined as the maximum of a(t)/2, where $\phi(t)$ is the phase of the original amplitude and phase modulated signal S(t). The constant amplitude envelopes of signals $S_1(t)$ and $S_2(t)$ allow the use of switched-mode implementations of power amplifiers 3A and 3B, respectively.

Prior Art FIG. 2 is similar to FIG. 1 in the article "A 2.4-GHz, 27-dBm Asymmetric Multilevel Outphasing Power Amplifier in 65-nm CMOS", by Philip A. Godoy, et al., IEEE Journal of solid-state circuits, Vol. 47, No. 10, pp. 2372-2384, October 2012, which is entirely incorporated herein by reference. (Also see related U.S. Pat. No. 8,164,384 entitled "Asymmetric Multilevel Outphasing Architecture for RF Amplifiers" issued Apr. 24, 2012 to Joel L. Dawson et al., also entirely incorporated herein by reference.) The above Godoy, et al. article shows an example of an asymmetric multi-level outphasing (AMO) transmitter including an "in-phase" input signal I(t) and a "quadrature" input signal Q(t) input to an AMO signal decomposition circuit 2 producing a pair of output signals $\Phi_1$ and $\Phi_2$ coupled to inputs of a pair of phase modulator circuits 1A and 1B, respectively. The outputs of phase modulators 1A and 1B are connected by conductors 14A and 14B to inputs of two switching power amplifiers 3A and 3B, respectively. Phase modulator 1A generates a signal $S_1(t)$ on conductor 14A and phase modulator 1B generates a signal $S_2(t)$ on conductor 14B.

In this example, a switching circuit 5A operates to selectively couple four supply voltages $V_{sup1}$, $V_{sup2}$, $V_{sup3}$, and $V_{sup4}$ to the supply voltage terminal 4A of power amplifier 3A and a switching circuit 5B operates to selectively couple $V_{sup1}$, $V_{sup2}$, $V_{sup3}$, and $V_{sup4}$ to the supply voltage terminal 4B of power amplifier 3B. AMO signal decomposition circuit 2 generates the power supply selection (i.e., power supply modulation) control signals $A_1(t)$ and $A_2(t)$ to switches 5A and 5B.

Power amplifier 3A generates a drive signal $S_1(t)_{OUT}$ on conductor 7A and provides it as an input to a combiner 10 (which can be an isolating or a non-isolating combiner). Similarly, power amplifier 3B generates a drive signal $S_2(t)_{OUT}$ on conductor 7B and provides it as another input to combiner 10. An output $S_{OUT}(t)$ of combiner 10 is coupled by conductor 10A to antenna 10B, which provides a load impedance. The above mentioned Godoy article provides a comprehensive explanation of how the various input signals may be generated. (A related reference is the article "Asymmetric Multilevel Outphasing Transmitter using Class-E PAs with Discrete Pulse Width Modulation" by SungWon Chung et al., IEEE MTT-S International Microwave Symposium, pp. 264-267, 23-28 May 2010.

Known Asymmetric Multi-level Outphasing (AMO) techniques use multiple power supply levels (e.g., $V_{sup1}$, $V_{sup2}$, . . . etc. in Prior Art FIG. 2) selectable by power supply selection signals $A_1(t)$ and $A_2(t)$ to improve the power efficiency at the RF power amplifier at "back-off" power levels.

Unfortunately, generating the multiple power supply levels and switching among them is undesirably/unacceptably power consuming and also is relatively difficult to implement. Another approach is to vary RF carrier signal duration, but this also causes undesirably high power consumption and is difficult to control.

Various kinds of switching power amplifiers, e.g., class D and class-E power amplifiers, have been used to implement power amplifiers such as amplifiers 3A and 3B in Prior Art FIG. 2. Basic class-E switching power amplifiers consist of a capacitor shunting a switching transistor, a series tuned load network, and a choke inductor. See F. Raab, "Idealized operation of the class-E tuned power amplifier", IEEE Transactions on Circuits and Systems, Vol. 24, No 12, pp. 725-735, December 1977.

In outphasing power amplifiers, the individual power amplifiers (such as class D or class-E power amplifiers) typically are switching amplifiers and therefore are very power-efficient. The power efficiency is defined as the output power delivered to the load divided by the total power supplied to the outphasing amplifier by the single or multiple supply voltages $V_{sup1}$, $V_{sup2}$, . . . etc. The amount of output power delivered to the load decreases as the phase shift $\theta$ between the two driving signals $S_1(t)$ and $S_2(t)$ increases. Increasing the phase difference $\theta$ between the driving signals $S_1(t)$ and $S_2(t)$ results in a reduction in power efficiency. When the outputs of two such power amplifiers are combined or added together, there may be substantial power loss in the combiner which reduces efficiency, and the efficiency decreases as the output/load power decreases.

There are two different combining techniques for the outputs of the switched power amplifiers of an outphasing power amplifier. One technique is using "isolated" power combiners and another technique is using "non-isolated" power combiners. Non-isolating combiners may be of various types, including Chireix combiners. In basic outphasing, a large phase difference between $S_1(t)$ and $S_2(t)$ (when low power is required at the load) results in power dissipation in the combiners. Consequently, power efficiency is reduced when power delivered to the load decreases. The technique disclosed in the above mentioned Godoy et. al reference attempts to improve power efficiency at various power back-off levels by using multiple power supplies. Although this increases power efficiency compared to that of basic outphasing, the Godoy et. al technique has other shortcomings, including the fact that generation of multiple power supply levels is difficult and costly, the switching results in losses that reduce power efficiency, and synchronization problem between power supply switching and RF signal paths results in signal nonlinearity.

Thus, there is an unmet need for a way to improve the power efficiency of multi-level outphasing power amplifiers while RF power amplifier therein are operating at low "back-off" power levels.

There also is an unmet need for a way to provide improved power efficiency and simplified implementation of multi-level outphasing power amplifiers operating at large "back-off" power levels without generating and switching among multiple power supply levels to provide operating supply voltage and power to the internal power amplifiers of the multi-level outphasing power amplifiers.

There also is an unmet need for an improved multi-level outphasing power amplifier having the combination of higher data rates, more efficient spectrum utilization, and higher power efficiency than prior multi-level outphasing power amplifiers.

There also is an unmet need for an improved multi-level outphasing power amplifier which avoids the linearity problems of prior asymmetric multi-level outphasing (AMO) power amplifiers due to switching among multiple supply voltages and synchronization problem between supply voltage selection signals and RF driving signals.

There also is an unmet need for an improved outphasing power amplifier having higher peak output power than has been economically achievable in outphasing power amplifiers.

There also is an unmet need for an improved multi-level outphasing power amplifier which improves battery life in handheld devices.

SUMMARY OF THE INVENTION

It is an object of the invention to provide a way to improve the power efficiency of multi-level outphasing power amplifiers while RF power amplifier therein are operating at large "back-off" power levels.

It is an object of the invention to both provide a way to improve the power efficiency of multi-level outphasing power amplifiers while RF power amplifier therein are operating at large "back-off" power levels and also provide simplified implementation of such multi-level outphasing power amplifiers.

It is an object of the invention to provide a way to provide improved power efficiency and simplified implementation of multi-level outphasing power amplifiers operating at large "back-off" power levels without generating and switching between multiple power supply levels to provide operating supply voltage and power to the internal power amplifiers of the multi-level outphasing power amplifiers.

It is another object of the invention to provide an improved multi-level outphasing power amplifier having the combination of higher data rates, more efficient spectrum utilization, and higher power efficiency than prior multi-level outphasing power amplifiers.

It is another object of the invention to provide an improved multi-level outphasing power amplifier which avoids the linearity problems of prior multi-level outphasing power amplifiers caused by switching among multiple supply voltages.

It is another object of the invention to provide an improved outphasing power amplifier having higher peak output power than has been economically achievable in outphasing power amplifiers.

It is another object of the invention to provide a way to provide improved power efficiency of multi-level outphasing power amplifiers operating at large "back-off" power levels without generating and switching between multiple power supply levels to provide operating supply voltage to the internal power amplifiers of the multi-level outphasing power amplifiers.

It is another object of the invention to provide an improved multi-level outphasing power amplifier having both improved linearity and signal path synchronization than prior multi-level outphasing power amplifiers.

Briefly described, and in accordance with one embodiment, the present invention provides a multi-level, multi-branch outphasing amplifier (20-1) that includes a first branch group circuit (22-1) including a first branch circuit (11) receiving a first RF input signal ($S_1(t)$) and first control information ($S_{11}$ Ctrl=$V_{DD}$) and a second branch circuit (12) receiving the first input signal and second control information ($S_{12}$ Ctrl). Each of the first (11) and second (12) branch circuits includes a power amplifier. The first control information enables the first branch circuit to remain on while the second branch circuit (12) is switched on or off by the second control information. A second branch group circuit (22-2) includes a third branch circuit (21) receiving a second RF input signal ($S_2(t)$) and third control information ($S_{21}$ Ctrl=$V_{DD}$) and a fourth branch circuit (22) receiving the second input signal $S_2(t)$ and fourth control information ($S_{22}$ Ctrl). Each of the third and fourth branch circuits includes a power amplifier. The third control information enables the third branch circuit to always remain on while the fourth branch circuit is switched on or off by the fourth control information. A combiner (24) combines output signals of the power amplifiers to produce an output signal ($S_{OUT}(t)$).

In one embodiment, the invention provides a multi-level, multi-branch outphasing amplifier (20-1,20-2) with a first branch group circuit (22-1) including a first branch circuit (11) receiving an RF first input signal ($S_1(t)$) and first control information ($S_{11\_}Ctrl=V_{DD}$) and a second branch circuit (12) receiving the first input signal ($S_1(t)$) and second control information ($S_{12\_}Ctrl$), each of the first (11) and second (12) branch circuits including a corresponding power amplifier (P11,P12). The second control information ($S_{21\_}Ctrl$) enables the second branch circuit (21) to be selectively switched on or off while the first branch circuit (11) remains in an on condition. A second branch group circuit (22-2) includes a third branch circuit (21) receiving an RF second input signal ($S_2(t)$) and third control information ($S_{21\_}Ctrl=V_{DD}$) and a fourth branch circuit (22) receiving the second input signal ($S_2(t)$) and fourth control information ($S_{22\_}Ctrl$). Each of the third (21) and fourth (22) branch circuits includes a corresponding power amplifier (P21,P22). The fourth control information ($S_{22\_}Ctrl$) enables the fourth branch circuit (22) to be selectively switched on or off while the third branch circuit (21) remains in an on condition. Combiner circuitry (24) combines output signals of the power amplifiers to produce an output signal ($S_{OUT}(t)$) across a load (R).

In one embodiment, the first, second, third, and fourth control information is included in first, second, third, and fourth logic signals ($S_{11\_}Ctrl, S_{12\_}Ctrl, S_{21\_}Ctrl, S_{22\_}Ctrl$), respectively. In another embodiment, the first, second, third, and fourth control information is included in corresponding RF signals that are applied to inputs of the power amplifiers, respectively.

In one embodiment the power amplifiers (P11,P12,P21, P22) are switching power amplifiers. In one embodiment the power amplifiers (P11,P12,P21,P22) are class-E power amplifiers.

In one embodiment each branch circuit includes an activation circuit (A11,A12,A21,A22) for enabling the first ($S_1(t)$) or the second ($S_2(t)$) input signal received by that branch circuit to be applied to the power amplifier of that branch circuit in response to the control signal ($S_{11\_}Ctrl, S_{12\_}Ctrl, S_{21\_}Ctrl, S_{22\_}Ctrl$) received by that branch circuit. In one embodiment each switching power amplifier (P11, P12,P21,P22) includes a switching transistor ($M_A,M_B$) having a gate capacitance. In one embodiment each branch circuit (11,12,21,22) includes a driver circuit (D11,D12, D21,D22), respectively, for charging the gate capacitance of a corresponding switching transistor ($M_A,M_B$). In one embodiment each activation circuit (A11,A12,A21,A22) includes a logical ANDing circuit.

In one embodiment, a third branch group circuit (22-3) includes a fifth branch circuit (11') receiving a third RF input signal ($S_1'(t)$) which is a complement of the first RF input signal ($S_1(t)$) and the first control information ($S_{11\_}Ctrl=V_{DD}$) and a sixth branch circuit (12') receiving the third RF input signal ($S_1'(t)$ and the second control information ($S_{12\_}Ctrl$). A fourth branch group circuit (22-4) includes a seventh branch circuit (21') receiving a fourth RF input signal ($S_2'(t)$) that is a complement of the second RF input signal ($S_2(t)$) and the third control information ($S_{21\_}Ctrl=V_{DD}$) and an eighth branch circuit (22') receiving the fourth RF input signal ($S_2'(t)$) and the fourth control information ($S_{22\_}Ctrl$). Each of the fifth (11'), sixth (12'), seventh (21'), and eighth (22') branch circuits also includes a corresponding power amplifier (P11',P12',P21',P22'). Outputs of the corresponding power amplifiers are combined by the combining circuitry (24) to produce the output signal ($S_{OUT}(t)$) across the load (R).

In the described embodiments, the control information corresponds to an amount of power being delivered to the load (R) by the multi-level, multi-branch outphasing amplifier compared to a peak amount of power which the multi-level, multi-branch outphasing amplifier (20-1,2) is capable of delivering to the load (R).

In one embodiment, the multi-level, multi-branch outphasing amplifier includes efficiency enhancement circuitry including a reactive efficiency element ($L_{EEC}$) coupled between the output of the power amplifiers in the multi-level, multi-branch outphasing amplifier branch circuits (11 or 12) of the first branch group circuit (22-1) and the output of the power amplifier of the corresponding branch circuit (21 or 22) of the second branch group circuit (22-2) to form a resonant network with reactive elements associated with those power amplifiers so as to reduce out-of-phase current when the amount of power delivered to the load (R) is relatively low.

In one embodiment, the multi-level, multi-branch outphasing amplifier includes power enhancement circuitry ($L_{PEC},C_{PEC}$) coupled to the output of one of the power amplifiers so as resonate at a predetermined frequency which is a harmonic frequency of a fundamental frequency of the RF first input signal ($S_1(t)$) and thereby reduce the peak voltage at the drain of the transistors so that supply voltages can be increased, leading to increased peak output power.

In one embodiment, the invention provides a method for operating a multi-level, multi-branch outphasing amplifier, including applying an RF first input signal ($S_1(t)$) to a first branch circuit (11) of a first branch group circuit (22-1) and to a second branch circuit (12) of the first branch group circuit (22-1) and also applying an RF second input signal ($S_2(t)$) to a third branch circuit (21) of a second branch group circuit (22-2) and to a fourth branch circuit (22) of the second branch group circuit (22-2); applying first control information ($S_{11\_}Ctrl=V_{DD}$) to the first branch circuit (11) to keep the first branch circuit (11) in an on condition while also applying second control information ($S_{12\_}Ctrl$) to the second (12) branch circuit to selectively turn a power amplifier (P12) of the second (12) branch circuit on or off; also applying third control information ($S_{12\_}Ctrl=V_{DD}$) to the third branch circuit (21) to keep the third branch circuit (21) in an on condition while also applying fourth control information ($S_{22\_}Ctrl$) to the fourth branch circuit (22) to selectively turn a power amplifier (P22) of the fourth branch circuit (22) on or off; and combining outputs of the power amplifiers to produce an output signal ($S_{OUT}(t)$) across a load (R).

In one embodiment, each branch circuit includes an activation circuit (A11,A12,A21,A22) and the method includes selectively turning that branch circuit on or off in response to the control signal ($S_{11\_}Ctrl, S_{12\_}Ctrl, S_{21\_}Ctrl, S_{22\_}Ctrl$) received by that branch circuit, and wherein the first, second, third, and fourth control information is included in first, second, third, and fourth logic signals ($S_{11\_}Ctrl, S_{12\_}Ctrl, S_{21\_}Ctrl, S_{22\_}Ctrl$), respectively.

In one embodiment the method includes providing the first, second, third, and fourth control information in RF signals that are applied to inputs of the power amplifiers, respectively. The method includes operating combiner circuitry (24) to combine the outputs of the power amplifiers of that branch circuit (11,12,21,22).

In a described embodiment the method includes causing the control information to correspond to an amount of power being delivered to the load (R) by the multi-level, multi-branch outphasing amplifier compared to a peak amount of power which the multi-level, multi-branch outphasing amplifier is capable of delivering to the load (R).

In one embodiment, the invention provides a multi-level, multi-branch outphasing amplifier (20-1,2) including means (14A) for applying an RF first input signal ($S_1(t)$) to a first branch circuit (11) of a first branch group circuit (22-1) and to a second branch circuit (12) of the first branch group circuit (22-1) and also applying an RF second input signal ($S_2(t)$) to a third branch circuit (21) of a second branch group circuit (22-2) and to a fourth branch circuit (22) of the second branch group circuit (22-2); means (37-1,38-1) for applying an RF first input signal ($S_1(t)$) to a first branch circuit (11) of a first branch group circuit (22-1) and to a second branch circuit (12) of the first branch group circuit (22-1) and also applying an RF second input signal ($S_2(t)$ to a third branch circuit (21) of a second branch group circuit (22-2) and to a fourth branch circuit (22) of the second branch group circuit (22-2); and means (24) for combining outputs of the power amplifiers to produce an output signal ($S_{OUT}(t)$) across a load (R).

DETAILED DESCRIPTION OF THE PREFERRED EMBODIMENTS

An asymmetric multi-level, multi-branch outphasing power amplifier includes multiple circuits, each of which includes a power amplifier (such as a class-E power amplifier) and combiner circuitry coupled to the output of that power amplifier. A first RF drive signal is coupled to inputs of all the power amplifiers of a first group of branch circuits, and a second RF drive signal is coupled to inputs of all of the power amplifiers of a second group of branch circuits. In one embodiment, each branch circuit of the first group includes an enable circuit or activation circuit that couples or enables the first drive signal to the inputs of the various power amplifiers in the first group of branch circuits in response to a first group of corresponding selection control signals. Similarly, each branch circuit of the second group includes an enable circuit or activation circuit that couples the second drive signal to the inputs of the various power amplifiers in the second group of branch circuits in response to a second group of corresponding selection control signals. In another embodiment, the activation circuits are omitted and instead the control information is in effect contained or embedded in the RF drive signal being applied to each branch circuit in the sense that the RF drive signal is zero if that branch circuit needs to be turned off.

Outputs of the first group of branch circuits all are coupled to inputs of the combiner or combining circuitry. Outputs of the second group of branch circuits are all coupled to inputs of the combiner. An output of the combiner is coupled to a load circuit. The individual branch circuits are in effect turned on and turned off according to power back-off conditions determined by the amount of current required by the load circuit (in contrast to switching between power supply voltages as in the prior art). The branch circuits that are turned ON provide the current presently demanded by the load.

Figure 1:
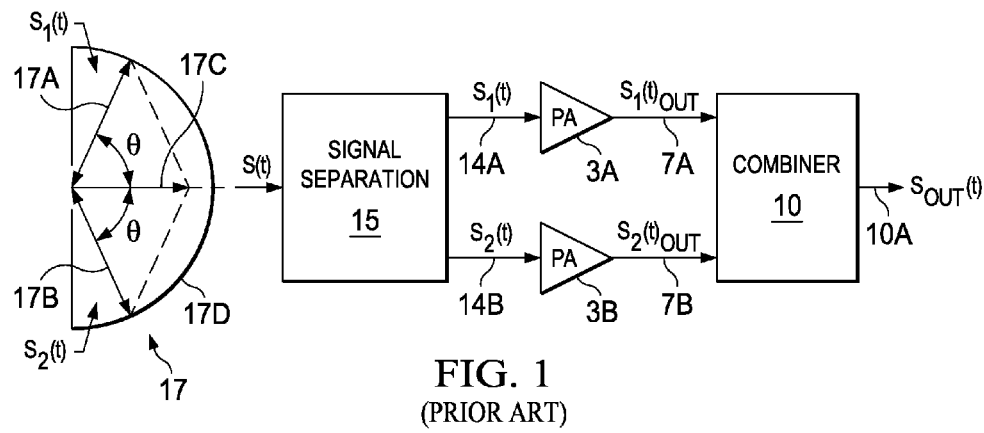
FIG. 1 is a diagram illustrating the technique for generating the phase modulated driving signals for outphasing power amplifiers.
Figure 2:
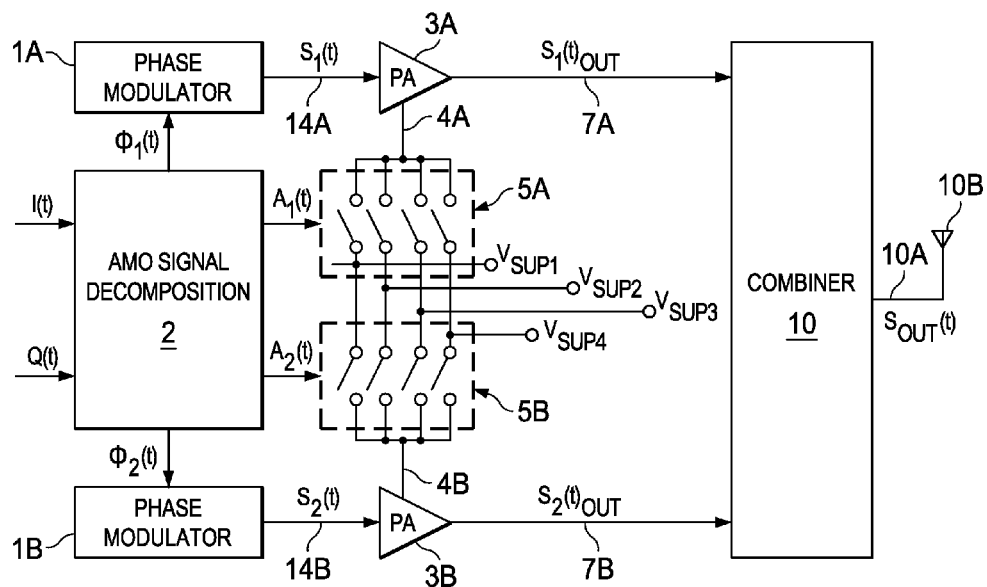
FIG. 2 is a diagram of a conventional asymmetric multi-level outphasing power amplifier.
Figure 3:
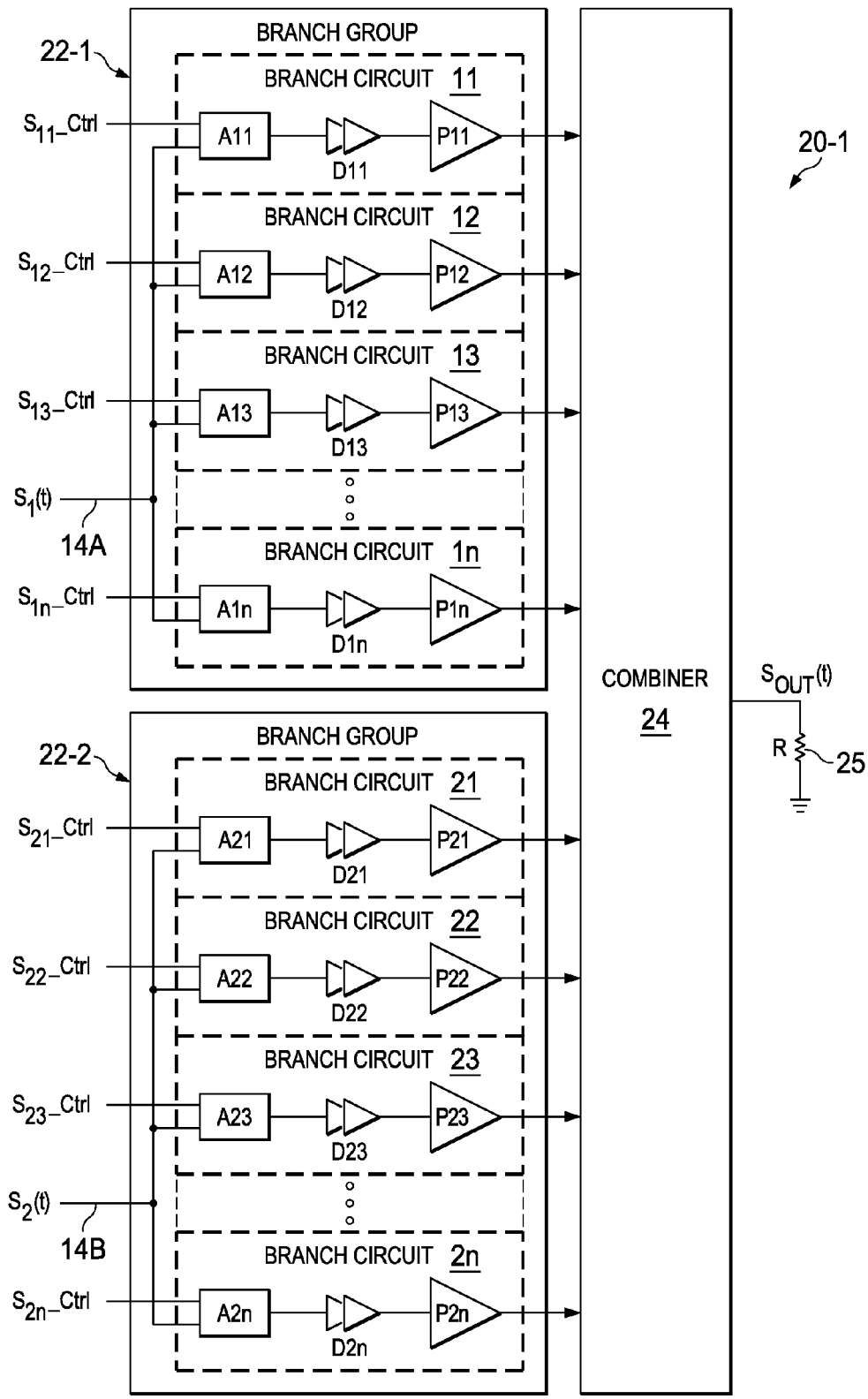
FIG. 3 is a generalized block diagram of a single-ended multi-level, multi-branch outphasing power amplifier operable from a single supply voltage.

FIG. 3 shows a single-ended multi-level, multi-branch outphasing power amplifier 20-1 which includes a first group 22-1 of branch circuits 11, 12, 13, . . . 1n, and also includes a second group 22-2 of branch circuits 21, 22, 23, . . . 2n. The multi-level, multi-branch outphasing power amplifier 20-1 can operate in symmetric or asymmetric mode. The terms "symmetric" and "asymmetric" mean that the number of branches turned ON in the first group and the number of branches turned ON in the second group can be the same (for "symmetric" operation) or different (for "asymmetric" operation). Each branch circuit includes an enable/activation circuit, a driver circuit (which may include an even number of series-coupled inverters), and a power amplifier having an output coupled to an input of a combiner. For example, branch 11 includes an enable/activation circuit A11 having a first input coupled by conductor 14A to receive RF drive signal $S_1(t)$ and an enable input coupled to receive a control signal $S_{11}$ Ctrl. Input signals $S_1(t)$ and $S_2(t)$ are phase modulated RF signals (similar to the input signals in the above mentioned Godoy reference). The output of enable/activation circuit A11 is connected to the input of driver circuit D11, the output of which is connected to the input of power amplifier P11. The output of power amplifier P11 is coupled to an input of combiner circuitry 24. Combiner 24 has an output coupled to one terminal of a load circuit 25 including a load resistor R having another terminal coupled to ground.

Similarly, branch circuit 12 includes an enable/activation circuit A12 having an input coupled by conductor 14A to receive drive signal $S_1(t)$ and an enable input coupled to receive a control signal $S_{12}$_Ctrl. The output of activation circuit A12 is connected to the input of driver circuit D12, the output of which is connected to the input of power amplifier P12. The output of power amplifier P12 is also coupled to an input of combiner circuit 24. The other branch circuits in first group 22-1 are configured similarly. The output $S_{OUT}(t)$ of combiner 24 is applied to load circuit R.

In second group 22-2, branch circuit 21 includes an activation circuit A21 having a signal input coupled by conductor 14B to receive drive signal $S_2(t)$ and an enable input coupled to receive a control signal $S_{21}\_Ctrl$. The output of activation circuit A21 is connected to the input of driver circuit D21, the output of which is connected to the input of power amplifier P21. The output of power amplifier P21 is coupled to an input of combiner 24. Branch circuits 22, 23, ..., 2n are essentially the same as branch circuit 21.

During operation of asymmetric multi-level multi-branch outphasing circuitry 20-1 in FIG. 3, the multiple branch circuits are individually selected or enabled to allow them, in response to the control signals $S_{11}\_Ctrl$, $S_{12}\_Ctrl$, $S_{13}\_Ctrl$, ..., $S_{21}\_Ctrl$, $S_{22}\_Ctrl$, $S_{23}\_Ctrl$, ..., etc., to be turned ON and OFF so that they can selectively respond to or not respond to a corresponding one of RF drive signals $S_1(t)$ and $S_2(t)$. Only a single power supply, such as $V_{DD}$, is used to provide the operating power to all of the multiple branch circuits of asymmetric multi-level, multi-branch outphasing power amplifier 20-1. (This is in direct contrast to the previously mentioned prior art AMO (asymmetric multi-level outphasing) systems, which all require switching among various power supply voltages to provide operating power to the power amplifiers, respectively, in accordance with the power back-off conditions.) When the maximum allowable current is demanded by the load, all of the branch circuits in the $S_1(t)$ side or section and the $S_2(t)$ side or section are turned ON, and as the load voltage or load current is reduced, individual branch circuits are gradually turned OFF. When the load current required by the load becomes very low, only one branch circuit from each of the $S_1(t)$ section and the $S_2(t)$ section remains turned ON.

Figure 4A:
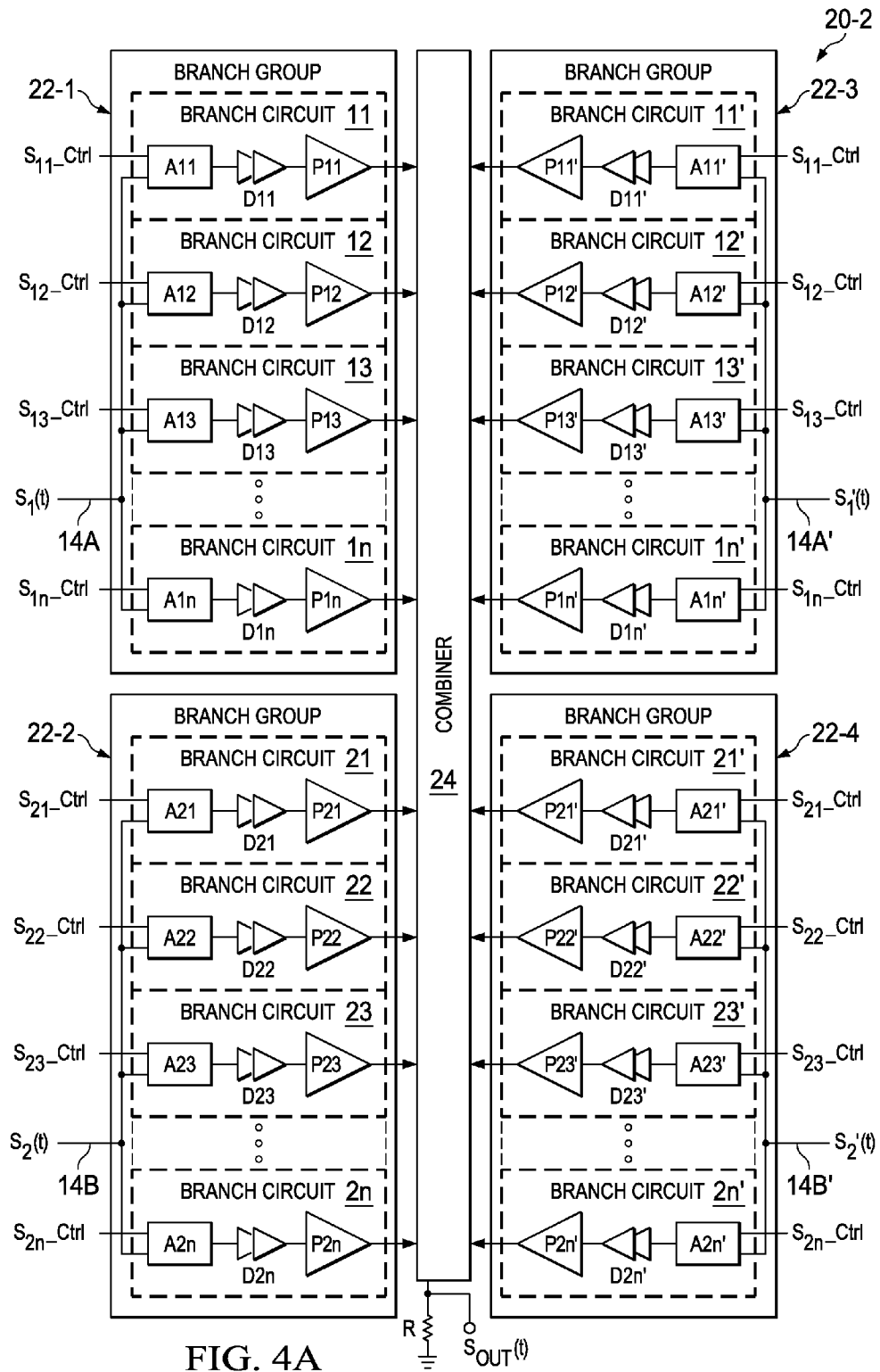
FIG. 4A is a generalized block diagram of a differential multi-level, multi-branch outphasing power amplifier operable from a single supply voltage.

FIG. 4A shows a differential multi-level, multi-branch outphasing power amplifier 20-2 which, as in FIG. 3, includes a first group 22-1 of branch circuits 11, 12, 13, ... 1n, and also includes a second group 22-2 of branch circuits 21, 22, 23, ... 2n. First group 22-1 and second group 22-2 in FIG. 4A are identical to first group 22-1 and second group 22-2 in FIG. 3.

Differential multi-level, multi-branch outphasing power amplifier 20-2 further includes a third group 22-3 of branch circuits 11', 12', 13', ... 1n and a fourth group 22-4 of branch circuits 21', 22', 23', ... 2n'. Third group 22-3 and fourth group 22-4 in FIG. 4A are structurally identical to first group 22-1 and second group 22-2, respectively. The power amplifier outputs of third group 22-3 and fourth group 22-4 are coupled to inputs of combiner 24. Combiner 24 has an output $S_{OUT}(t)$ coupled to load resistor R.

The designations of the drive signals and components in third group 22-3 and fourth group 22-4 are the same as for first group 22-1 and second group 22-2, respectively, except that the designation for each drive signal and each component in third group 22-3 and fourth group 22-4 is followed by the "prime" character ('). For example, in third group 22-3, branch 11' includes an activation circuit A11' having a signal input coupled by conductor 14A' to receive drive signal $S_1'(t)$ and an enable input coupled to receive the control signal $S_{11}\_Ctrl$. The output of activation circuit A11' is connected to the input of driver circuit D11', the output of which is connected to the input of power amplifier P11'. The output of power amplifier P11' is coupled to an input of combiner 24 and so forth, and similarly for fourth group 22-4 and RF drive signal $S_2'(t)$. The drive signals SA0 and $S_2'(t)$ are phase shifted 180° with respect to (i.e., are the complements of) the drive signals $S_1(t)$ and $S_2(t)$, respectively. (Combiner block 24 consists of various passive circuit elements, for example as shown in subsequently described FIGS. 7A and 7B, and are coupled to the various power amplifiers and are selected to match their output impedance to the impedance of the load circuit so as to achieve maximum power transfer and also are selected to effectively combine the output signals of the various branch groups 22-1, 22-2, 22-3, and 22-4 and couple them to the load.)

Conceptually, the basic operation of the multi-level, multi-branch outphasing power amplifiers of FIGS. 3 and 4A is generally similar to the operation of known multi-level outphasing power amplifiers, but instead of switching between various power supply voltages, various numbers of branch circuits are selectively turned on and off, depending on the back-off load current and the load power requirement of the multi-branch outphasing amplifiers, wherein the objective is to improve efficiency by minimizing phase difference ($\theta$) between the driving waveforms and by turning off branch circuits whenever possible according to power back-off requirements.

Thus, FIGS. 3 and 4A show single-ended and differential implementations, respectively, of the multi-level, multi-branch outphasing power amplifier technique described herein. Generation of the RF drive signals $S_1(t)$ and $S_2(t)$ and $S_1'(t)$ and $S_2'(t)$ is explained with reference to subsequently described FIGS. 4B, 4C, and 5. The control signals $S_{11}\_Ctrl$, $S_{12}\_Ctrl$, $S_{13}\_Ctrl$, ..., $S_{21}\_Ctrl$, $S_{22}\_Ctrl$, $S_{23}\_Ctrl$, ..., etc., in FIG. 4A are used with enable/activation circuits to either apply $S_1(t)$ and $S_2(t)$ and $S_1'(t)$ and $S_2'(t)$ signals to the respective branch circuits to enable (i.e., turn them on) or to disable (i.e., turn them off).

Alternatively, however, instead of using the above control signals, RF signals can be generated for every branch, as subsequently explained with reference to FIGS. 6A and 6B. In that case more input signals will be required, but the activation circuits would not be required.

The power amplifiers (PAs) can be implemented by means of various kinds of switched-mode power amplifiers (such as class-D, class-E, class-F, etc.) and the combiner circuits may be implemented by means of various kinds of outphasing combiners (such as isolated or non-isolated combiners, passive combiners, transmission lines, Chireix combiners, ... etc.

Figure 4B:
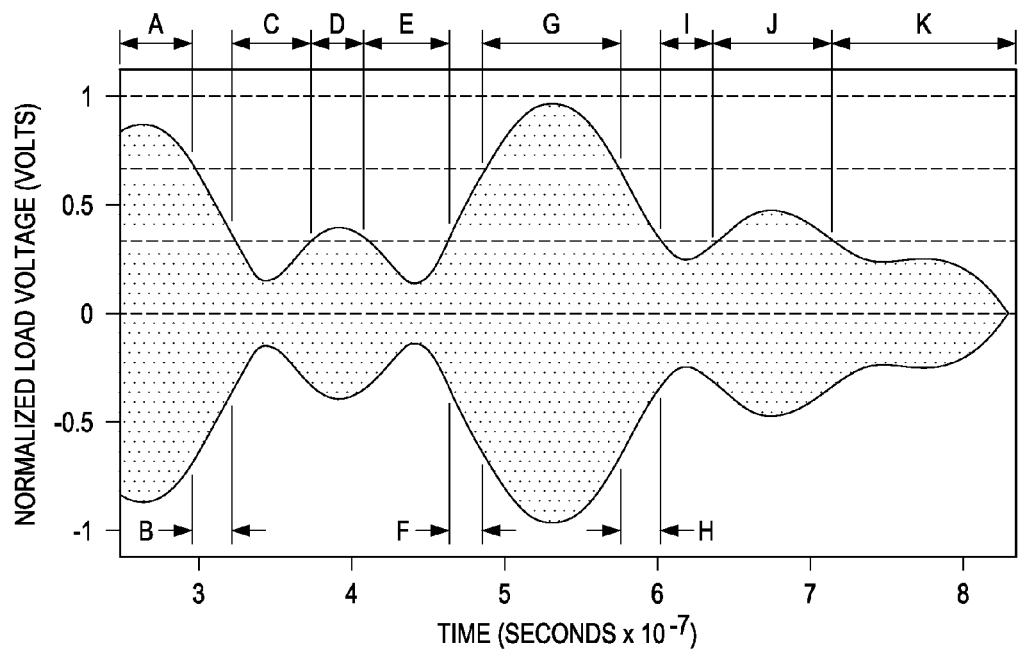
FIGS. 4B and 4C are diagrams illustrating generation of control signals used in the system of FIGS. 3 and 4A.

FIG. 4B shows the typical normalized output voltage of multi-level, multi-branch outphasing amplifier 20-2 of FIGS. 3 and 4A across the load R. The normalized waveform is divided into segments or regions A, B, ..., K, according to the load voltage levels, wherein different load voltage levels are indicated by the horizontal dotted lines.

Figure 4C:
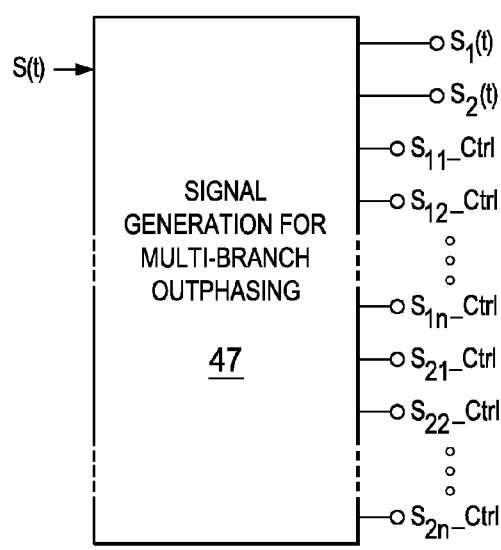

The multi-branch outphasing signal generation circuit 47 in FIG. 4C generates the control signals $S_{11}\_Ctrl$, $S_{12}\_Ctrl$, $S_{13}\_Ctrl$, ..., $S_{21}\_Ctrl$, $S_{22}\_Ctrl$, $S_{23}\_Ctrl$, ..., etc., so as to suitably adapt the operation of multi-level, multi-branch outphasing amplifiers 20-1 and 20-2 of FIGS. 3 and 4A to the present amount of output current or power being demanded by the load R according to the input data and modulation technique used.

The control signals $S_{11}\_Ctrl$, $S_{12}\_Ctrl$, $S_{13}\_Ctrl$, ..., $S_{21}\_Ctrl$, $S_{22}\_Ctrl$, $S_{23}\_Ctrl$, ..., etc. are generated based on instantaneous amplitude levels of S(t). FIG. 4B shows an example of multi-branch outphasing PA which has two branches for the $S_1(t)$ section and two branches for the $S_2(t)$ section therefore generates the four control signals $S_{11}\_Ctrl$, $S_{12}\_Ctrl$, $S_{21}\_Ctrl$ and $S_{22}\_Ctrl$ such that one branch circuit from the $S_1(t)$ section and one branch circuit from the $S_2(t)$ section remain always turned ON ($S_{11}\_Ctrl$ and $S_{21}\_Ctrl$ are always equal to 1), similarly to the example shown and subsequently described in FIGS. 7A and 7B. The regions A, B, ..., K in FIG. 4B are determined by instantaneous amplitude level of S(t) as shown by the horizontal dotted lines (the control signals change when the instantaneous amplitude level of S(t) crosses the horizontal dotted lines), and the corresponding control signal levels are shown in Table 1.

TABLE 1

A: $S_{12}$_Ctrl = 1, $S_{22}$_Ctrl = 1
B: $S_{12}$_Ctrl = 1, $S_{22}$_Ctrl = 0
C: $S_{12}$_Ctrl = 0, $S_{22}$_Ctrl = 0
D: $S_{12}$_Ctrl = 1, $S_{22}$_Ctrl = 0
E: $S_{12}$_Ctrl = 0, $S_{22}$_Ctrl = 0
F: $S_{12}$_Ctrl = 1, $S_{22}$_Ctrl = 0
G: $S_{12}$_Ctrl = 1, $S_{22}$_Ctrl = 1
H: $S_{12}$_Ctrl = 1, $S_{22}$_Ctrl = 0
I: $S_{12}$_Ctrl = 0, $S_{22}$_Ctrl = 0
J: $S_{12}$_Ctrl = 1, $S_{22}$_Ctrl = 0
K: $S_{12}$_Ctrl = 0, $S_{22}$_Ctrl = 0
($S_{11}$_Ctrl = 1 $S_{21}$_Ctrl = 1 always)

Figure 5:
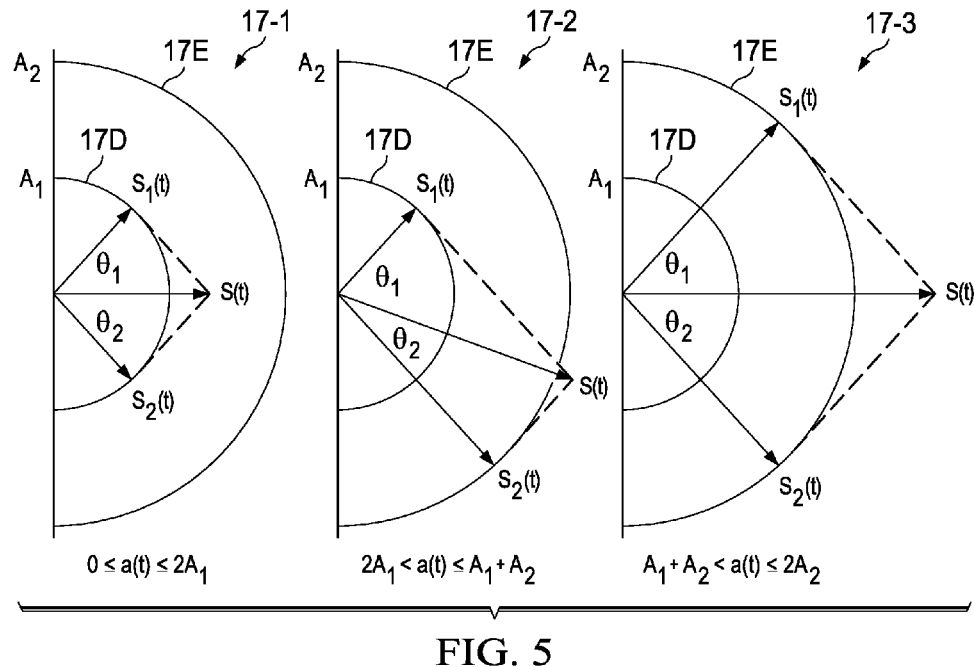
FIG. 5 is a diagram useful in explaining generation of the phase modulated driving signals for the multi-level, multi-branch outphasing power amplifier of FIGS. 3 and 4A.

FIG. 5 indicates generally how the input drive signals $S_1(t)$ and $S_2(t)$ for the multi-level multi-branch outphasing power amplifiers shown in FIGS. 3 and 4 are produced from an amplitude and phase modulated signal S(t). (The RF signals S(t), $S_1(t)$, and $S_2(t)$ are represented in FIG. 5 by the illustrated vectors.) In this case, the number "n" of branch circuits of the asymmetric, multi-level, multi-branch outphasing amplifiers of FIGS. 3 and 4 determines the number "n" of different amplitude levels (and hence the number of concentric circles in FIG. 5) of the drive signal vectors $S_1(t)$ and $S_2(t)$. In the example of FIG. 5, the RF drive signal generation is indicated for two branch circuits, i.e., for the case wherein n=2. The two radii $A_1$ and $A_2$ of the half-circles 17D and 17E, respectively, in FIG. 5 indicate the length of the RF drive signal vectors $S_1(t)$ and $S_2(t)$. $A_1$ corresponds to the case wherein only one branch circuit is enabled or turned on and $A_2$ corresponds to the case when both branch circuits are enabled or turned on. The following three cases illustrate the generation of drive signals $S_1(t)$ and $S_2(t)$:

(1) When $0 \leq a(t) \leq 2A_1$, the signal generation is similar to conventional outphasing signal generation with $A=A_1$. In this case $S_{11}$_Ctrl=1, $S_{12}$_Ctrl=0, $S_{21}$_Ctrl=1, and $S_{22}$_Ctrl=0 to turn on only one branch from the $S_1(t)$ and $S_2(t)$ sides of the diagrams of FIGS. 3 and 4.

(2) When $A_1+A_2<a(t)-2A_2$, the signal generation scheme is same as the conventional outphasing signal generation with $A=A_2$. In this case $S_{11}$_Ctrl=1, $S_{12}$_Ctrl=1, $S_{21}$_Ctrl=1, and $S_{22}$_Ctrl=1 to turn on both of the branch circuits from $S_1(t)$ and $S_2(t)$ sides of the diagrams of FIGS. 3 and 4.

(3) For $2A_1 \leq a(t) \leq A_1+A_2$, the signals can be generated as follows:

$$S_1(t) = A_1 e^{j[\varphi(t)+\theta_1(t)]}$$

$$S_2(t) = A_2 e^{j[\varphi(t)-\theta_2(t)]}$$

$$\theta_1(t) = \cos^{-1}\left[\frac{A_1^2 + |a(t)|^2 - A_2^2}{2|a(t)|A_1}\right]$$

$$\theta_2(t) = \cos^{-1}\left[\frac{A_2^2 + |a(t)|^2 - A_1^2}{2|a(t)|A_2}\right].$$

In this case $S_{11}$_Ctrl=1, $S_{12}$_Ctrl=0, $S_{21}$_Ctrl=1, and $S_{22}$_Ctrl=1 to turn on only one branch of the $S_1(t)$ side and both of the branch circuits of $S_2(t)$ sides. (Note that in the description of the previous examples for these conditions it was shown only that one branch of the $S_2(t)$ side and both of the branch circuits of $S_1(t)$ sides were turned ON.)

The described multi-branch outphasing power amplifier can be used in the following different modes:

(i) assymetric multi-level, multi-branch outphasing: the $S_1(t)$ and $S_2(t)$ vectors can be of the same length or different length; the magnitude level and the phase of the $S_1(t)$ and $S_2(t)$ vectors change depending on the envelope power level;

(ii) symmetric multi-level, multi-branch outphasing: the $S_1(t)$ and $S_2(t)$ vectors are always of same length but magnitude level and phase of the $S_1(t)$ and $S_2(t)$ vectors change depending on the envelope power level; and (iii) single level multi-branch outphasing: the $S_1(t)$ and $S_2(t)$ vectors are always of same length and magnitude of the $S_1(t)$ and $S_2(t)$ vectors always remain same, but phase of the $S_1(t)$ and $S_2(t)$ vectors change depending on the envelope power level. An advantage of having multiple branch circuits in single level operation mode is it allows increasing the amount of peak output power delivered to the load by combining output power (and current) of multiple branches.

The control signals $S_{11}$_Ctrl, $S_{12}$_Ctrl, $S_{13}$_Ctrl, ..., $S_{21}$_Ctrl, $S_{22}$_Ctrl, $S_{23}$_Ctrl, ..., etc., change at the modulation envelope frequency of the RF signal S(t). The overall multi-level, multi-branch outphasing power amplifier operation is generally similar to the conventional AMO operation except that instead of using multiple power supply voltage sources to adjust the amount of power delivered to the load in accordance with the current required by the load, multiple branch circuits are utilized to generate different magnitudes of the signals $S_1(t)$ and $S_2(t)$, i.e., to create different vector lengths of $S_1(t)$ and $S_2(t)$ in FIG. 5. When the load requires only a very small current to be supplied to it, a large phase angle θ is needed between $S_1(t)$ and $S_2(t)$ and most of the PA branch circuits are turned off and only one or a few low-current-supplying branch circuits are turned on so that the total delivered load current is appropriately small. In contrast, in a conventional AMO architecture, the required very low power output level is achieved by switching to a particular low voltage power supply.

Figure 6B:
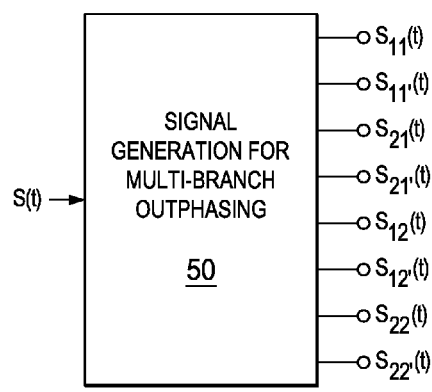
FIGS. 6A and 6B are diagrams illustrating an alternative system for generating the RF input signals for the individual power amplifiers in FIG. 4A without requiring use of separate digital control signals.
Figure 6A:
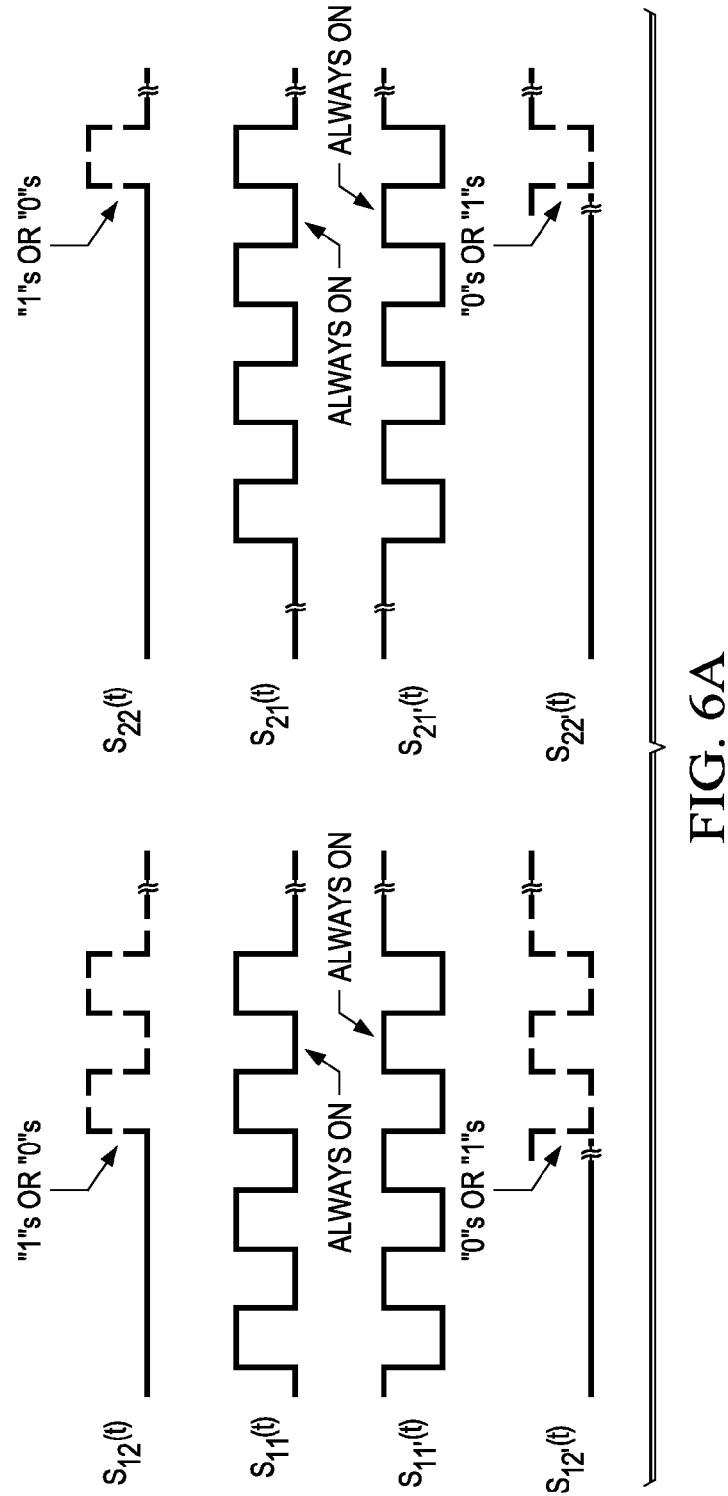

Instead of using activation/enable circuits controlled by the above-mentioned control signals $S_{11}$_Ctrl, $S_{12}$_Ctrl, $S_{13}$_Ctrl, ..., $S_{21}$_Ctrl, $S_{22}$_Ctrl, $S_{23}$_Ctrl, ..., etc., to control the individual power amplifiers, the control information may be contained or embedded in the RF signals applied to the inputs of the various power amplifiers P11, P12, etc., as shown by the 8 waveforms in FIG. 6A. FIG. 6A illustrates the above-mentioned RF signals for the various power amplifier drive signals $S_{11}(t)$, $S_{12}(t)$, ... and $S_{21}(t)$, $S_{22}(t)$, .... For example, in FIG. 6A, it will be assumed that branch circuits 11, 11', 21, and 21' are always ON, and the remaining branch circuits can be turned either ON or OFF in accordance with the previously mentioned various power back-off-levels. In this example, the RF input signals $S_{11}(t)$, $S_{11}'(t)$, $S_{21}(t)$, and $S_{21}'(t)$ are applied to the inputs of individual power amplifiers P11, P11', P21, and P21', respectively, and will be continuous, i.e., always switching, and always delivering power to the load R as shown in FIG. 6A. The remaining RF input signals $S_{12}(t)$, $S_{12}'(t)$, $S_{22}(t)$, and $S_{22}'(t)$ applied to the inputs of individual power amplifiers P12, P12', P22, and P22', respectively, can be non-switching for some of the time and can be switching for the rest of the time in accordance with the previously mentioned various power back-off-off levels.

Referring to FIG. 6B, the signal S(t), which represents the load current level or other signal representative of the output power level delivered to load R, is provided as an input to multi-branch outphasing signal generation circuit 50. Multi-branch outphasing signal generation circuit 50 in FIG. 6B accordingly generates the various RF power amplifier drive signals $S_{11}(t)$, $S_{11}(t)$, ... and $S_{21}(t)$, $S_{22}(t)$, ... that are provided as inputs to the corresponding power amplifiers P11, P12, etc., such that each output signal of multi-branch outphasing signal generation circuit 50 is either a switching signal or is instead equal to 0 in accordance with the present back-off requirement. For example, when all of the individual branch circuits are in effect turned ON and are delivering power to the load R, every branch circuit will be receiving the RF switching signal. For lower load current or load power levels, one or more of the branch circuits will be receiving a 0 value of its RF input signal. As is evident from the waveforms shown in FIG. 6A, the non-zero portions of the signals $S_{12}(t)$, $S_{12}'(t)$, $S_{22}(t)$, and $S_{22}'(t)$ are identical to corresponding portions of drive signals $S_1(t)$ and $S_2(t)$, and all portions of the waveforms of $S_{11}(t)$, $S_{11}'(t)$, $S_{21}(t)$, and $S_{21}'(t)$ are always identical to corresponding portions of drive signals $S_1(t)$ and $S_2(t)$. It is evident that this RF signal generation technique requires more signals (i.e., 8 signals vs. 4 signals) to be generated than is the case in which drive signals $S_1(t)$ and $S_2(t)$ and control signals $S_{12}\_Ctrl$ and $S_{22}\_Ctrl$ are required ($S_{11}\_Ctrl$ and $S_{21}\_Ctrl$ are always equal to 1). (That is, 8 signals vs. 4 signals in previous case, i.e., $S_1(t)$, $S_2(t)$, $S_{12}\_Ctrl$ and $S_{22}\_Ctrl$).

Figure 7A:
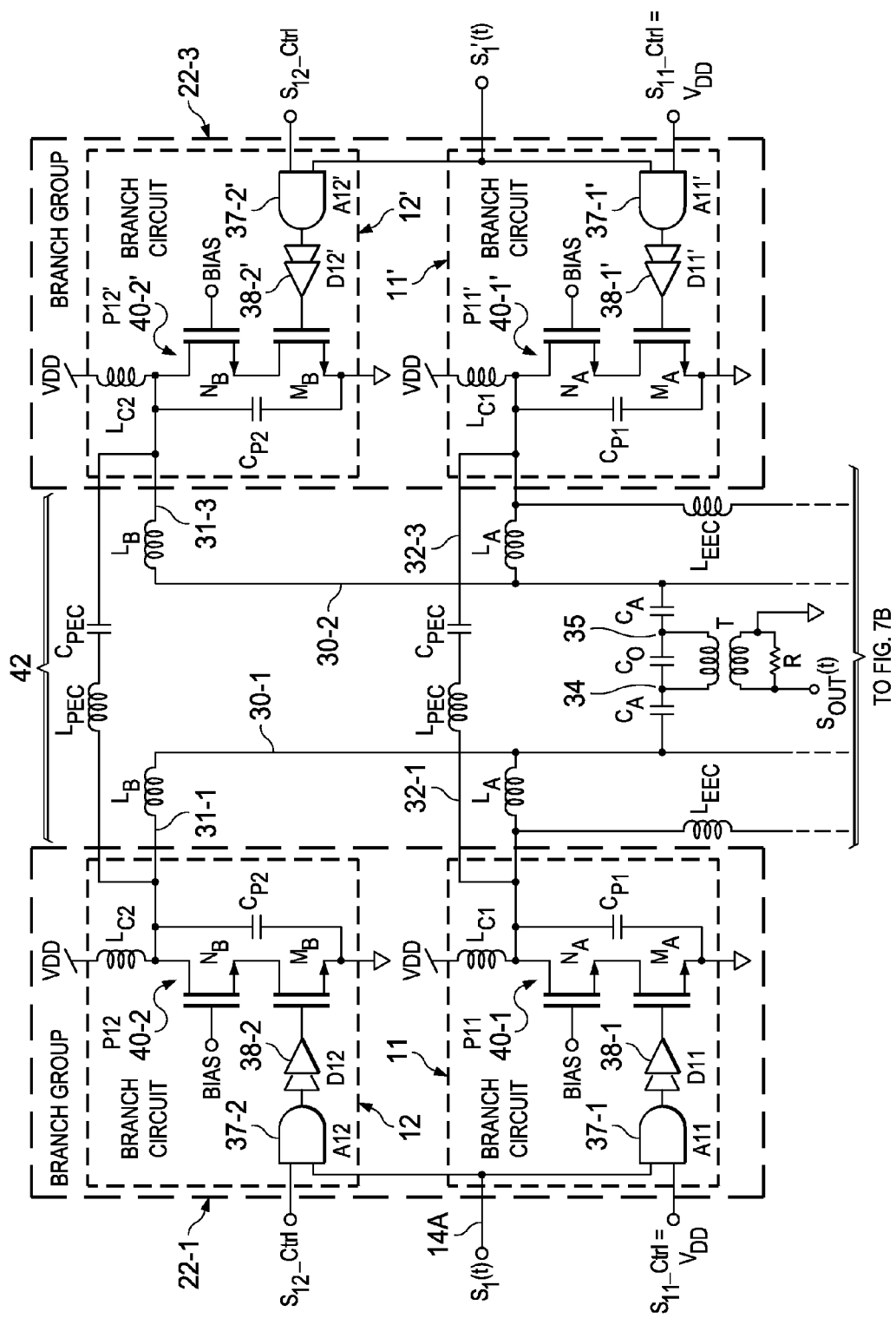
FIGS. 7A and 7B constitute a schematic diagram of the multilevel, multi-branch outphasing power amplifier of FIG. 4A.
Figure 7B:
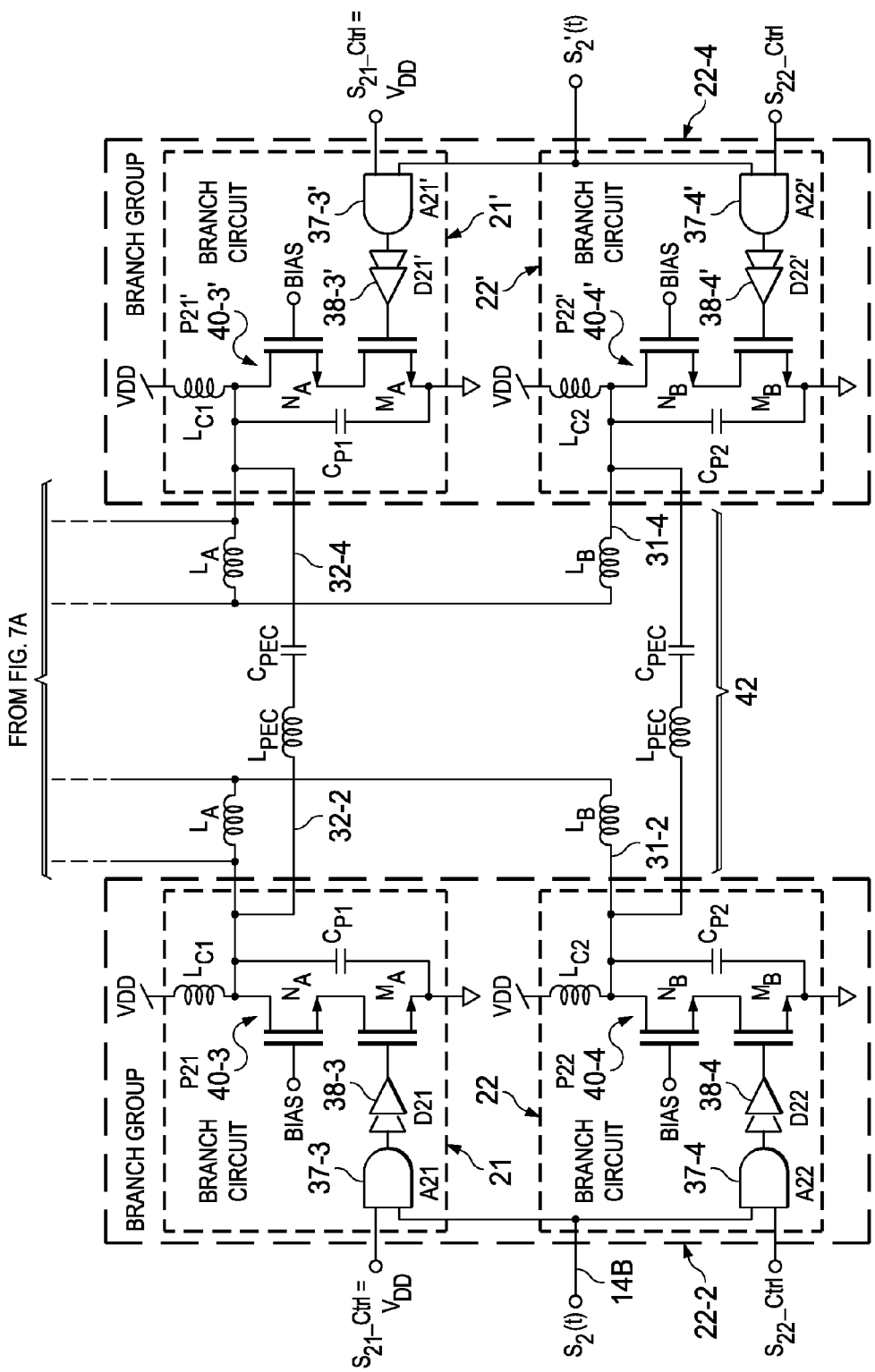

FIGS. 7A and 7B illustrate a practical implementation of a differential, asymmetric, multi-level, multi-branch outphasing power amplifier generally based on the multi-branch outphasing power amplifier block diagram shown in FIG. 4A. In FIGS. 7A and 7B, the first group of branch circuits 22-1 includes an upper branch circuit 12 and a lower branch circuit 11. The upper branch circuits and lower branch circuits are sized differently. The sizing of the branch circuits is determined by the signal statistics and the power levels at which efficiency peaks are located. The lower branch circuit 11 includes an AND gate 37-1, which corresponds to enable/activation circuit A11 in FIG. 4A. A first input of AND gate 37-1 receives control signal $S_{11}\_Ctrl$ equal to $V_{DD}$ and a second input of AND gate 37-1 receives the drive signal $S_1(t)$. The output of AND gate 37-1 is connected to the input of a driver circuit 38-1 which corresponds to driver circuit D11 in FIG. 4A. The class-E power amplifier 40-1 in FIGS. 7A and 7B corresponds to power amplifier P11 in FIG. 4A. Class-E power amplifier 40-1 includes an N-channel MOS switching transistor $M_A$, a N-channel cascode transistor $N_A$, an inductor $L_{C1}$, and a capacitor $C_{P1}$. (The capacitors $C_{P1}$ and $C_{P2}$ can be the output capacitance of power amplifier or a parallel combination of output capacitor of the power amplifier and an external capacitor.) The gate of switching transistor $M_A$ is connected to the output of driver circuit 38-1. The source of switching transistor $M_A$ is connected to ground, and its drain is connected to the source of cascode transistor $N_A$. The gate of cascode transistor $N_A$ is connected to a cascode bias voltage Bias, and its drain is connected to one terminal of inductor $L_{C1}$, to one terminal of an inductor $L_A$, and to one terminal of capacitor $C_{P1}$. The other terminal of inductor $L_{C1}$ is connected to power supply voltage $V_{DD}$.

The upper branch circuit 12 of the first group 22-1 includes an AND gate 37-2, which corresponds to enable/activation circuit A12 in FIG. 4A. A first input of AND gate 37-2 receives control signal $S_{12}\_Ctrl$ and a second input of AND gate 37-2 receives the drive signal $S_1(t)$. The output of AND gate 37-2 is connected to the input of a driver circuit 38-2 which corresponds to driver D12 in FIG. 4A. A class-E power amplifier 40-2 in FIGS. 7A and 7B corresponds to power amplifier P12 in FIG. 4A. Class-E power amplifier 40-2 includes an N-channel MOS switching transistor $M_B$, a N-channel cascode transistor $N_B$, an inductor $L_{C2}$, and a capacitor $C_{P2}$. The gate of switching transistor $M_B$ is connected to the output of driver circuit 38-2. The source of switching transistor $M_B$ is connected to ground and its drain is connected to the source of cascode transistor $N_B$. The gate of cascode transistor $N_B$ is connected to cascode bias voltage Bias, and its drain is connected to one terminal of an inductor $L_{C2}$, to one terminal of an inductor $L_B$, and to one terminal of capacitor $C_{P2}$. The other terminal of inductor $L_{C2}$, is connected to $V_{DD}$.

In FIGS. 7A and 7B, the second group of branch circuits 22-2 includes an upper branch circuit 21 and a lower branch circuit 22. The lower branch circuit includes an AND gate 37-4, which corresponds to activation circuit A22 in FIG. 4A. A first input of AND gate 37-4 receives control signal $S_{22}\_Ctrl$ and a second input of AND gate 37-4 receives the drive signal $S_2(t)$. The output of AND gate 37-4 is connected to the input of a driver circuit 38-4 which corresponds to driver D22 in FIG. 4A. A class-E power amplifier 40-4 in FIGS. 7A and 7B corresponds to power amplifier P22 in FIG. 4A. Class-E power amplifier 40-4 includes an N-channel MOS switching transistor $M_B$, an N-channel cascode transistor $N_B$, an inductor $L_{C2}$, and a capacitor $C_{P2}$. The gate of switching transistor $M_B$ is connected to the output of driver circuit 38-4. The source of switching transistor $M_B$ is connected to ground and its drain is connected to the source of cascode transistor $N_B$. The gate of cascode transistor $N_B$ is connected to cascode bias voltage Bias, and its drain is connected to one terminal of inductor $L_{C2}$, to one terminal of an inductor $L_B$, and to one terminal of capacitor $C_{P2}$. The other terminal of inductor $L_{C2}$, is connected to $V_{DD}$.

The upper branch circuit 21 of the second group 22-2 includes an AND gate 37-3, which corresponds to activation circuit A21 in FIG. 4A. A first input of AND gate 37-3 receives control signal $S_{21}\_Ctrl$ equal to $V_{DD}$ and a second input of AND gate 37-3 also receives the drive signal $S_2(t)$. The output of AND gate 37-3 is connected to the input of a driver circuit 38-3 which corresponds to driver D21 in FIG. 4A. A class-E power amplifier 40-3 in FIGS. 7A and 7B corresponds to power amplifier P21 in FIG. 4A. Class-E power amplifier 40-3 includes an N-channel MOS switching transistor $M_A$, an N-channel cascode transistor $N_A$, an inductor $L_{C1}$, and a capacitor $C_{P1}$. The gate of switching transistor $M_A$ is connected to the output of driver circuit 38-3. The source of switching transistor $M_A$ is connected to ground and its drain is connected to the source of cascode transistor $N_A$. (The driver circuits D11, D12, . . . etc. typically are required because the switching transistors $M_A$ and $M_B$ of the power amplifiers are very large transistors with a very large gate capacitance.) The gate of cascode transistor $N_A$ is connected to cascode bias voltage Bias, and its drain is connected to one terminal of an inductor $L_{C1}$, to one terminal of an inductor $L_A$, and to one terminal of capacitor $C_{P1}$. The other terminal of inductor $L_{C1}$ is connected to $V_{DD}$.

The implementation of branch groups 22-3 and 22-4 in FIGS. 7A and 7B is essentially the same as the implementation of branch groups 22-1 and 22-2, respectively, except that the drive signals $S_1(t)$ and $S_2(t)$ for branch groups 22-1 and 22-2 are replaced by drive signals $S_1'(t)$ and $S_2'(t)$ for branch groups 22-3 and 22-4, respectively. The symbols designating the various circuit elements in groups 22-3 and 22-4 are the same as in groups 22-1 and 22-2, respectively, except that each symbol is includes a prime ('), except at the control signals on the left side are the same as on the right side.

Specifically, in FIGS. 7A and 7B, the third group of branch circuits 22-3 includes an upper branch circuit 12' and a lower branch circuit 11'. The lower branch circuit 11' includes an AND gate 37-1', which corresponds to enable/activation circuit A11' in FIG. 4A. A first input of AND gate 37-1' receives control signal $S_{11}$_Ctrl equal to $V_{DD}$ and a second input of AND gate 37-1' receives the drive signal $S_1'(t)$. The output of AND gate 37-1' is connected to the input of a driver circuit 38-1' which corresponds to driver circuit D11' in FIG. 4A. A class-E power amplifier 40-1' in FIGS. 7A and 7B corresponds to power amplifier P11' in FIG. 4A. Class-E power amplifier 40-1' includes an N-channel MOS switching transistor $M_A$, an N-channel cascode transistor $N_A$, an inductor $L_{C1}$, and a capacitor $C_{P1}$. The gate of switching transistor $M_A$ is connected to the output of driver circuit 38-1'. The source of switching transistor $M_A$ is connected to ground, and its drain is connected to the source of cascode transistor $N_A$. The gate of cascode transistor $N_A$ is connected to a cascode bias voltage Bias, and its drain is connected to one terminal of inductor $L_{C1}$, to one terminal of an inductor $L_A$, and to one terminal of capacitor $C_{P1}$. The other terminal of inductor $L_{C1}$, is connected to power supply voltage $V_{DD}$.

The upper branch circuit 12' of the third group 22-3 includes an AND gate 37-2', which corresponds to enable/activation circuit A12' in FIG. 4A. A first input of AND gate 37-2' receives $S_{12}$_Ctrl and a second input of AND gate 37-2' receives the drive signal $S_1'(t)$. The output of AND gate 37-2' is connected to the input of a driver circuit 38-2' which corresponds to driver D12' in FIG. 4A. A class-E power amplifier 40-2' in FIGS. 7A and 7B corresponds to power amplifier P12' in FIG. 4A. Class-E power amplifier 40-2' includes an N-channel MOS switching transistor $M_B$, an N-channel cascode transistor $N_B$, an inductor $L_{C2}$, and a capacitor $C_{P2}$. The gate of switching transistor $M_B$ is connected to the output of driver circuit 38-2'. The source of switching transistor $M_B$ is connected to ground and its drain is connected to the source of cascode transistor $N_B$. The gate of cascode transistor $N_B$ is connected to cascode bias voltage Bias, and its drain is connected to one terminal of an inductor $L_{C2}$, to one terminal of an inductor $L_B$, and to one terminal of capacitor $C_{P2}$. The other terminal of inductor $L_{C2}$ is connected to $V_{DD}$.

In FIGS. 7A and 7B, the fourth group of branch circuits 22-4 includes an upper branch circuit 21' and a lower branch circuit 22'. The lower branch circuit 22' includes an AND gate 37-4', which corresponds to activation circuit A22' in FIG. 4A. A first input of AND gate 37-4' receives $S_{22}$_Ctrl and a second input of AND gate 37-4' receives the drive signal $S_2'(t)$. The output of AND gate 37-4' is connected to the input of a driver circuit 38-4' which corresponds to driver D22' in FIG. 4A. A class-E power amplifier 40-4' in FIGS. 7A and 7B corresponds to power amplifier P22' in FIG. 4A. Class-E power amplifier 40-4' includes an N-channel MOS switching transistor $M_B$, an N-channel cascode transistor $N_B$, an inductor $L_{C2}$, and a capacitor $C_{P2}$. The gate of switching transistor $M_B$ is connected to the output of driver circuit 38-4'. The source of switching transistor $M_B$ is connected to ground and its drain is connected to the source of cascode transistor $N_B$. The gate of cascode transistor $N_B$ is connected to cascode bias voltage Bias, and its drain is connected to one terminal of inductor $L_{C2}$, to one terminal of an inductor $L_B$, and to one terminal of capacitor $C_{P2}$. The other terminal of inductor $L_{C2}$ is connected to $V_{DD}$.

The upper branch circuit 21' of the fourth group 22-4 includes an AND gate 37-3', which corresponds to activation circuit A21' in FIG. 4A. A first input of AND gate 37-3' receives control signal $S_{21}$_Ctrl equal to $V_{DD}$ and a second input of AND gate 37-3' also receives the drive signal $S_2'(t)$.

The output of AND gate 37-3' is connected to the input of a driver circuit 38-3' which corresponds to driver D21' in FIG. 4A. A class-E power amplifier 40-3' in FIGS. 7A and 7B corresponds to power amplifier P21' in FIG. 4A. Class-E power amplifier 40-3' includes an N-channel MOS switching transistor $M_A$, an N-channel cascode transistor $N_A$, an inductor $L_{C1}$, and a capacitor $C_{P1}$. The gate of switching transistor $M_A$ is connected to the output of driver circuit 38-3'. The source of switching transistor $M_A$ is connected to ground and its drain is connected to the source of cascode transistor $N_A$. (The driver circuits D11, D12, . . . etc. typically are required because the switching transistors $M_A$ and $M_B$ of the power amplifiers are very large transistors with a very large gate capacitance.) The gate of cascode transistor $N_A$ is connected to cascode bias voltage Bias, and its drain is connected to one terminal of an inductor $L_{C1}$, to one terminal of an inductor $L_A$, and to one terminal of capacitor $C_{P1}$. The other terminal of inductor $L_{C1}$ is connected to $V_{DD}$.

In FIGS. 7A and 7B, an inductor $L_B$ is connected between conductor 31-1 and conductor 30-1, and similarly, another inductor $L_B$ is connected between conductor 31-3 and conductor 30-2. An inductor $L_{PEC}$ and capacitor $C_{PEC}$ are connected in series between conductors 31-1 and 31-3. An inductor $L_A$ is connected between conductor 32-1 and conductor 30-1 and another inductor $L_A$ is connected between conductor 32-3 and conductor 30-2. Another inductor $L_{PEC}$ and capacitor $C_{PEC}$ are connected in series between conductors 32-1 and 32-3. Also, another inductor $L_A$ is connected between conductor 32-2 and conductor 30-1 and another inductor $L_A$ is connected between conductor 32-4 and conductor 30-2. Another inductor $L_{PEC}$ and capacitor $C_{PEC}$ are connected in series between conductors 32-2 and 32-4. Another inductor $L_B$ is connected between conductor 31-2 and conductor 30-1, and another inductor $L_B$ is connected between conductor 31-4 and conductor 30-2. Another inductor $L_{PEC}$ and capacitor $C_{PEC}$ are connected in series between conductors 31-2 and 31-4.

Also, an inductor $L_{EEC}$ is connected between conductors 32-1 and 32-2, and another inductor $L_{EEC}$ is connected between conductors 32-3 and 32-4. A capacitor $C_A$ is connected between conductor 30-1 and conductor 34. An output capacitor $C_O$ is connected between conductors 34 and 35, and another capacitor $C_A$ is connected between conductors 35 and 30-2. The primary winding of a transformer T is connected across output capacitor $C_O$ between conductors 34 and 35. A secondary winding of transformer T is connected across a load resistor R, and one terminal of the secondary winding is connected to ground. The output voltage $S_{OUT}(t)$ is developed across the load resistor R.

It should be understood that individual branch circuits can be sized "asymmetrically" in order to maximize the power efficiency of the outphasing power amplifier, depending on the characteristics of the amplitude and phase modulated RF signal S(t) such that efficiency peaks are obtained at particular back-off power levels and overall average efficiency is maximized.

In the operation of the asymmetric multi-level, multi-branch outphasing power amplifier of FIGS. 7A and 7B, one $S_1(t)$ (and also one $S_1'(t)$) branch circuit and one $S_2(t)$ (and also one $S_2'(t)$) branch circuit are always turned on, and the other branch circuits are turned on or off in response to the various control signals $S_{12}$_Ctrl and $S_{22}$_Ctrl.

Each series-connected combination of an inductor $L_{PEC}$ and a capacitor $C_{PEC}$ forms a Power Enhancement Circuit (PEC) which can be tuned to the third harmonic of the fundamental RF frequency (although other harmonics could be used), and the result of doing that is to "shape" the drain voltages of the N-channel cascode transistors $N_A$ and $N_B$ of the class-E power amplifiers such that the peak drain voltages are reduced for all phase angle differences between $S_1(t)$ and $S_2(t)$. This allows increasing the power supply voltage $V_{DD}$ (thereby also increasing the maximum output power that can be delivered to the load R by each class-E power amplifier) without exceeding the transistor drain voltage reliability limit.

Each inductor $L_{EEC}$ forms an Efficiency Enhancement Circuit (EEC). The vectors $S_1(t)$ and $S_2(t)$ have in-phase (phase difference is 0) and out-of-phase (phase difference is 180°) components. For the "in-phase" components of the $S_1(t)$ and $S_2(t)$ vectors, the efficiency enhancement circuit EEC does not conduct any current because the voltages on both conductors 32-1 and 32-2 are equal (and the voltages on conductors 32-3 and 32-4 also are equal). But for the "out-of-phase" components of the $S_1(t)$ and $S_2(t)$ vectors, each inductor $L_{EEC}$ forms a parallel resonant network with the corresponding capacitor $C_{P1}$ and the corresponding inductor $L_A$ and thereby reduces amount of out-of-phase current flowing through the parallel resonant network by presenting a large impedance to the corresponding class-E power amplifier at that resonant frequency. This improves the overall efficiency under large "power back-off" operating conditions. (Depending on the particular circuit design, the EEC circuit could be a capacitor ($C_{EEC}$).

In FIGS. 7A and 7B the switching on and off of the power amplifier switch transistor at the fundamental frequency results in a sinusoidal voltage signal at the fundamental frequency on the drain of the cascode transistor. The above-mentioned power enhancement circuitry (PEC) operates to add a third harmonic (or possibly other harmonics) of the fundamental frequency to the fundamental frequency signal in such a way that the peak drain voltage is reduced. When the phase angle θ between the RF drive signals $S_1(t)$ and $S_2(t)$ changes with respect to time, the drain voltages also change with respect to time. The third harmonic is added to the fundamental frequency signal in such a way as to decrease the cascode transistor peak drain voltage across all possible values of the phase angle θ between the $S_1(t)$ and $S_2(t)$ input signals.

Thus, the power enhancement circuitry (PEC) includes $L_{PEC}$ and $C_{PEC}$ and operates to reduce the peak drain voltages of the cascode transistors $N_A$ and $N_B$. This allows the power supply $V_{DD}$ to be increased without exceeding the allowable transistor drain voltage limits so that a higher amount of peak output power can be delivered to the load resistor R.

Figure 8:
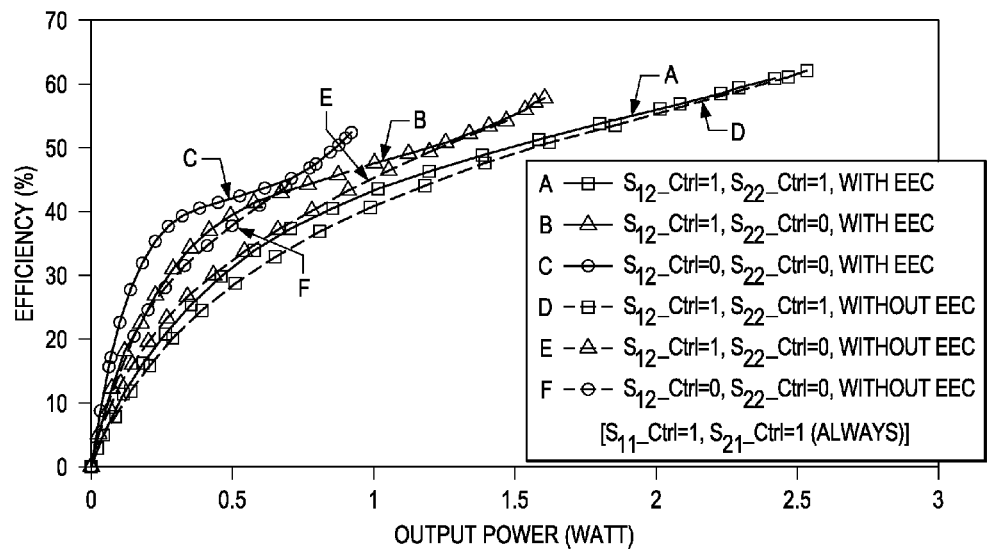
FIG. 8 is a graph illustrating power efficiency versus output power for several variations of the multilevel, multi-branch outphasing power amplifier shown in FIGS. 7A and 7B.
Figure 9:
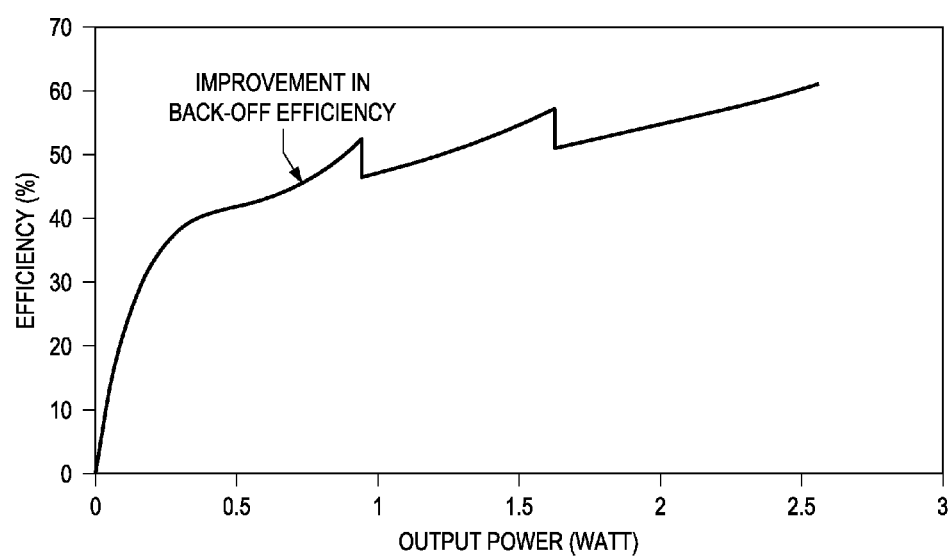
FIG. 9 is a graph illustrating effective efficiency versus output power for the multilevel, multi-branch outphasing power amplifier of FIGS. 7A and 7B.

FIG. 8 shows simulated curves of efficiency versus output power for the circuitry shown in FIGS. 7A and 7B for different levels of the control signals with and without the efficiency enhancement circuit. FIG. 9 shows an effective (combined) simulated efficiency curve which shows significant improvement in back-off efficiency of the multi-level, multi-branch outphasing power amplifier.

The described asymmetric, multi-level, multi-branch outphasing power amplifiers have a number of advantages over the prior art multi-level outphasing amplifiers. No complex power supply voltage switching circuitry is required. The inefficient supply voltage switching circuitry of prior AMO amplifiers is eliminated and the power loss and undesirably high power inefficiency caused by the power supply voltage switching in the prior AMO amplifiers therefore are avoided. The multi-branch outphasing power amplifier circuit 20-1 is easier to implement than the power supply modulation/switching of the prior AMO amplifiers because generating the multiple power supply voltage levels in prior AMO amplifiers requires multiple regulators circuits and other related circuits which are costly. Also, the power supply switching in the prior AMO amplifiers causes significant signal nonlinearity and also causes another kind of nonlinearity that arises from the inevitable signal timing mismatches between the control signal paths into the power supply switching circuits and the input drive signal paths. The described multi-level, multi-branch outphasing power amplifier avoids such signal timing problems (since all of the signals are applied to the inputs of the switching-mode power amplifiers and they can be easily synchronized) and associated nonlinearity of the outphasing power amplifier output signal by not including such multiple signal paths to supply voltage switching and power amplifier input. Furthermore, the use of multiple separately enabled branch circuits to combine the branch circuit output currents allows a large peak current and a large variation in the amount of total current delivered to the load. Also, the multi-level, multi-branch outphasing amplifier can be operated in either single-level mode or multi-level mode. There is some benefit of having multi-branch structure but operating it in single-level mode, because it can produce higher peak output power levels than a single-branch structure.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, some of the disclosed inductors can be interchanged with some of the disclosed capacitors. In some cases, the positions of the $L_A$, $L_B$ inductors and $C_A$ capacitors may be interchanged. $L_{EEC}$ can be placed between other branch circuits i.e. one end to 31-1 and other end to 31-2 and for the right side one end to 31-3 and other end to 31-4). In some cases the $L_{EEC}$ inductor can be replaced by a capacitor. In some cases common components can be utilized to perform the functions of the Efficiency Enhancement Circuit (EEC) and the Power Enhancement Circuit (PEC). Other kinds of combiners can also be used, for example Chireix combiners. The switching power amplifiers could be other types than class-E amplifiers. Also, it would be possible to use RF signals for performing the functions of the disclosed logic signals $S_{11}$_Ctrl, $S_{12}$_Ctrl, $S_{13}$_Ctrl, ..., $S_{21}$_Ctrl, $S_{22}$_Ctrl, $S_{23}$_Ctrl, ..., etc. Such RF signals could be configured to appear as switching signals with appropriate phase modulation to the power amplifiers during time intervals in which the receiving power amplifiers should be turned on and to appear as "0"s during time intervals in which power amplifiers are to be turned off.

What is claimed is:

1. A multi-level, multi-branch outphasing amplifier comprising:
   a first branch group circuit including:
      a first branch circuit including a first activation circuit and a first power amplifier, the first activation circuit coupled to receive an RF first input signal and a first control signal, the first activation circuit configured to selectively enable and disable the RF first input signal from being transmitted to the first power amplifier responsive to the first control signal; and
      a second branch circuit including a second activation circuit an a second power amplifier, the second activation circuit coupled to receive the RF first input signal and a second control signal, the second activation circuit configured to selectively enable and disable the RF first input signal from being transmitted to the second power amplifier responsive to the second control signal;

a second branch group circuit including:
a third branch circuit including a third activation circuit and a third power amplifier, the third activation circuit coupled to receive an RF second input signal and a third control signal, the third activation circuit configured to selectively enable and disable the RF second input signal from being transmitted to the third power amplifier responsive to the third control signal;

a fourth branch circuit including a fourth activation circuit and a fourth power amplifier, the fourth activation circuit coupled to receive the RF second input signal and a fourth control signal, the fourth activation circuit configured to selectively enable and disable the RF second input signal from being transmitted to the fourth power amplifier responsive to the fourth control signal; and combiner circuitry for combining output signals of the first, second, third and fourth power amplifiers and producing an output signal across a load;

wherein a single constant-value voltage supply supplies power to the first branch group circuit and to the second branch group circuit, and wherein a number of enabled RF input signals in the first branch group circuit and a number of enabled RF input signals in the second branch group circuit is selected to be the same or different depending on a power demand of the load or on a backoff load current.

2. The multi-level, multi-branch outphasing amplifier of claim 1 wherein the first, second, third, and fourth power amplifiers are switching power amplifiers.

3. The multi-level, multi-branch outphasing amplifier of claim 2 wherein the first, second, third, and fourth power amplifiers are class-E power amplifiers.

4. The multi-level, multi-branch outphasing amplifier of claim 2 wherein each of the first, second, third, and fourth amplifiers includes a respective switching transistor having a gate capacitance.

5. The multi-level, multi-branch outphasing amplifier of claim 4 wherein each branch circuit includes a respective driver circuit for charging the gate capacitance of a switching transistor.

6. The multi-level, multi-branch outphasing amplifier of claim 1 further including
a third branch group circuit including a fifth branch circuit coupled to receive an RF third input signal, which is a complement of the RF first input signal, and the first control information and a sixth branch circuit coupled to receive the RF third input signal and the second control information;
a fourth branch group circuit including a seventh branch circuit coupled to receive an RF fourth input signal which is a complement of the RF second input signal, and the third control information and an eighth branch circuit coupled to receive the RF fourth input signal and the fourth control information, each of the fifth, sixth, seventh, and eighth branch circuits also including a respective power amplifier; and
outputs of the corresponding power amplifiers of the fifth, sixth, seventh, and eighth branch circuits coupled to the combining circuitry.

7. The multi-level, multi-branch outphasing amplifier of claim 1 wherein each activation circuit includes a respective logical ANDing circuit.

8. The multi-level, multi-branch outphasing amplifier of claim 1 wherein each of the first, second, third, and fourth control signals is indicative of an amount of power being delivered to the load by the multi-level, multi-branch outphasing amplifier compared to a peak amount of power which the multi-level, multi-branch outphasing amplifier is capable of delivering to the load.

9. The multi-level, multi-branch outphasing amplifier of claim 1 including efficiency enhancement circuitry including a reactive efficiency element coupled between the output of the power amplifiers in the multi-level, multi-branch outphasing amplifier branch circuits of the first branch group circuit and the output of the power amplifier of the corresponding branch circuit of the second branch group circuit to form a resonant network with reactive elements associated with those power amplifiers so as to reduce out-of-phase current when the amount of power delivered to the load is relatively low.

10. The multi-level, multi-branch outphasing amplifier of claim 1 including power enhancement circuitry coupled to the output of one of the power amplifiers so as resonate at a predetermined frequency which is a harmonic frequency of a fundamental frequency of the RF first input signal and thereby reduce a peak transistor drain voltage for all phase angles between the first and second input signals so that a power supply voltage of the multi-level, multi-branch outphasing amplifier can be increased without causing a predetermined transistor drain voltage limitation to be exceeded.

11. The multi-level, multi-branch outphasing amplifier of claim 1, wherein the first and second activation circuits are configured to selectively enable and disable the RF first input signal, and the third and fourth activation circuits are configured to selectively enable and disable the RF second input signal, in dependence on a power demand of the load.

12. A multi-level, multi-branch outphasing amplifier, comprising:
a first plurality of branch circuits coupled to receive a first input signal to be amplified, each branch circuit of the first plurality of branch circuits including a respective power amplifier;
a second plurality of branch circuits coupled to receive a second input signal to be amplified, each branch circuit of the second plurality of branch including a respective power amplifier, the second input signal being phase-shifted with respect to the first input signal;
a third plurality of branch circuits coupled to receive a third input signal to be amplified, each branch circuit of the third plurality of branch circuits including a respective power amplifier, the third input signal being 180 degrees out of phase with respect to the first input signal;
a fourth plurality of branch circuits coupled to receive a fourth input signal to be amplified, each branch circuit of the fourth plurality of branch circuits including a respective power amplifier, the fourth input signal being 180 degrees out of phase with respect to the second input signal;
a combiner circuit coupled to outputs of the power amplifiers of the first, second, third, and fourth pluralities of branch circuits and to generate an output signal for a load,
wherein a number of branch circuits in which the respective activation circuits enable the corresponding first, second, third, or fourth input signal is selected to be the same in, or different among, different ones of the first, second, third and fourth pluralities of branch circuits depending on a power demand of the load or on a backoff load current.

13. The multi-level, multi-branch outphasing amplifier of claim 12, wherein each of the branch circuits of the first, second, third, and fourth pluralities of branch circuits includes a respective activation circuit to selectively enable or disable the corresponding first, second, third, or fourth input signal, depending on a power demand of the load, from reaching the corresponding power amplifier.

14. The multi-level, multi-branch outphasing amplifier of claim 12, further comprising a signal generator to generate the first, second, third, and fourth input signals, wherein:
- the first input signal comprises, for each of the branch circuits of the first plurality of branch circuits, a respective input signal that is separately enabled and disabled by the signal generator;
- the second input signal comprises, for each of the branch circuits of the second plurality of branch circuits, a respective input signal that is separately enabled and disabled by the signal generator;
- the third input signal comprises, for each of the branch circuits of the third plurality of branch circuits, a respective input signal that is separately enabled and disabled by the signal generator; and
- the fourth input signal comprises, for each of the branch circuits of the fourth plurality of branch circuits, a respective input signal that is separately enabled and disabled by the signal generator.

\* \* \* \* \*